(12) United States Patent
Boss et al.

(10) Patent No.: US 12,471,413 B2
(45) Date of Patent: Nov. 11, 2025

(54) LED MODULE, LED DISPLAY MODULE AND METHOD OF MANUFACTURING THE SAME

(71) Applicant: OSRAM Opto Semiconductors GmbH, Regensburg (DE)

(72) Inventors: Ruth Boss, Neutraubling (DE); Sebastian Wittmann, Regenstauf (DE); Korbinian Perzlmaier, Regensburg (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 741 days.

(21) Appl. No.: 17/605,533

(22) PCT Filed: Mar. 24, 2020

(86) PCT No.: PCT/EP2020/058124
§ 371 (c)(1),
(2) Date: Oct. 21, 2021

(87) PCT Pub. No.: WO2020/216549
PCT Pub. Date: Oct. 29, 2020

(65) Prior Publication Data
US 2022/0231193 A1    Jul. 21, 2022

(30) Foreign Application Priority Data

Apr. 23, 2019  (DE) .................... 10 2019 110 500.5
Sep. 25, 2019  (DE) .................... 10 2019 125 875.8
Jan. 29, 2020  (WO) ................ PCT/EP2020/052191

(51) Int. Cl.
*H01L 33/24* (2010.01)
*A61B 5/00* (2006.01)
(Continued)

(52) U.S. Cl.
CPC ......... *H10H 20/821* (2025.01); *A61B 5/6898* (2013.01); *H01L 25/0753* (2013.01);
(Continued)

(58) Field of Classification Search
None
See application file for complete search history.

(56) References Cited

U.S. PATENT DOCUMENTS 4,897,614 A    1/1990  Nishio
4,979,002 A    12/1990 Pankove
(Continued)

FOREIGN PATENT DOCUMENTS

DE    19744793 A1    4/1998
DE    19751649 A1    5/1999
(Continued)

OTHER PUBLICATIONS

International Search Report issued in corresponding International Application No. PCT/EP2020/058124 dated Jul. 3, 2020.
(Continued)

*Primary Examiner* — Michelle Mandala
(74) *Attorney, Agent, or Firm* — ArentFox Schiff LLP

(57) ABSTRACT

The invention relates to a method for manufacturing modules with one or more optoelectronic components, comprising the steps: producing at least one layer stack providing a base module on a carrier having a first layer, an active layer formed thereon, and a second layer formed thereon; exposing a surface area of the first layer facing away from the carrier; forming a first contact to a surface region of the second layer facing away from the carrier; and forming a second contact to the surface area of the first layer facing away from the carrier.

31 Claims, 14 Drawing Sheets

(51) Int. Cl.
  *H01L 25/075*  (2006.01)
  *H01L 25/16*   (2023.01)
  *H01L 33/00*   (2010.01)
  *H10H 20/01*   (2025.01)
  *H10H 20/812*  (2025.01)
  *H10H 20/821*  (2025.01)
  *H10H 20/84*   (2025.01)
  *H10H 20/857*  (2025.01)

(52) U.S. Cl.
  CPC ......... *H01L 25/167* (2013.01); *H10H 20/018* (2025.01); *H10H 20/812* (2025.01); *H10H 20/84* (2025.01); *H10H 20/857* (2025.01); *H10H 20/034* (2025.01); *H10H 20/0364* (2025.01)

(56) References Cited

U.S. PATENT DOCUMENTS

| | | |
|---|---|---|
| 5,103,271 A | 4/1992 | Izumiya et al. |
| 5,526,063 A | 6/1996 | Joubert et al. |
| 5,537,171 A | 7/1996 | Ogino et al. |
| 5,858,814 A | 1/1999 | Goossen et al. |
| 6,048,751 A | 4/2000 | D'Asaro et al. |
| 6,316,286 B1 | 11/2001 | Trezza |
| 6,527,456 B1 | 3/2003 | Trezza |
| 6,531,328 B1 | 3/2003 | Chen |
| 6,881,982 B2 | 4/2005 | Okuyama et al. |
| 7,067,339 B2 | 6/2006 | Biwa et al. |
| 7,101,050 B2 | 9/2006 | Magarill et al. |
| 7,390,097 B2 | 6/2008 | Magarill |
| 7,808,005 B1 | 10/2010 | Fattal et al. |
| 8,049,233 B2 | 11/2011 | Fukshima et al. |
| 8,269,238 B2 | 9/2012 | Kim et al. |
| 8,349,116 B1 | 1/2013 | Bibl et al. |
| 8,586,965 B2 | 11/2013 | Toyoda et al. |
| 8,816,324 B2 | 8/2014 | Fukui et al. |
| 9,202,988 B2 | 12/2015 | Yoshida et al. |
| 9,318,645 B2 | 4/2016 | Tani et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,520,537 B2 | 12/2016 | Bower et al. |
| 9,698,308 B2 | 7/2017 | Bower et al. |
| 9,705,042 B2 | 7/2017 | Bower et al. |
| 9,923,013 B1 | 3/2018 | Yamashita et al. |
| 9,991,423 B2 | 6/2018 | Bower et al. |
| 9,997,102 B2 | 6/2018 | Rotzoll et al. |
| 10,069,036 B2 | 9/2018 | Atanackovic |
| 10,096,585 B2 | 10/2018 | Tanaka et al. |
| 10,147,849 B2 * | 12/2018 | Xu .......................... H01L 33/42 |
| 10,162,182 B2 | 12/2018 | Jepsen |
| 10,177,195 B2 | 1/2019 | Ahmed et al. |
| 10,224,460 B2 | 3/2019 | Bower et al. |
| 10,395,589 B1 | 8/2019 | Vahid Far et al. |
| 10,396,241 B1 * | 8/2019 | Perkins ................ H01L 33/025 |
| 10,405,406 B2 | 9/2019 | Liszt |
| 10,418,517 B2 | 9/2019 | Atanackovic |
| 10,446,719 B2 | 10/2019 | Bower et al. |
| 10,466,487 B2 | 11/2019 | Blum et al. |
| 10,490,695 B2 | 11/2019 | Gomez-Iglesias et al. |
| 10,522,787 B1 | 12/2019 | Montgomery et al. |
| 10,622,514 B1 | 4/2020 | Atanackovic |
| 10,802,334 B2 | 10/2020 | Kim et al. |
| 10,833,225 B2 | 11/2020 | Bower et al. |
| 10,903,193 B2 | 1/2021 | Yamada |
| 10,963,103 B1 | 3/2021 | Shahmohammadi |
| 10,985,143 B2 | 4/2021 | Bower et al. |
| 11,156,759 B2 | 10/2021 | Brick et al. |
| 11,300,827 B2 | 4/2022 | Hwang et al. |
| 11,302,248 B2 | 4/2022 | Halbritter |
| 11,367,807 B2 | 6/2022 | Wada et al. |
| 11,513,275 B2 | 11/2022 | Brick et al. |
| 11,538,852 B2 | 12/2022 | Varghese et al. |
| 11,552,057 B2 | 1/2023 | Chae et al. |
| 12,176,461 B2 | 12/2024 | Chen et al. |
| 2002/0072138 A1 | 6/2002 | Trezza et al. |
| 2002/0074553 A1 | 6/2002 | Starikov et al. |
| 2003/0013230 A1 | 1/2003 | Dudoff et al. |
| 2003/0141507 A1 | 7/2003 | Krames et al. |
| 2003/0168666 A1 | 9/2003 | Okuyama et al. |
| 2003/0189125 A1 | 10/2003 | Trierenberg |
| 2004/0146219 A1 | 7/2004 | Sathyanarayana |
| 2004/0189627 A1 | 9/2004 | Shirasaki et al. |
| 2005/0174768 A1 | 8/2005 | Conner |
| 2005/0194598 A1 | 9/2005 | Kim et al. |
| 2005/0237488 A1 | 10/2005 | Yamasaki et al. |
| 2005/0264472 A1 | 12/2005 | Rast |
| 2006/0002247 A1 | 1/2006 | Kim et al. |
| 2006/0043402 A1 | 3/2006 | Suehiro et al. |
| 2006/0163435 A1 | 7/2006 | Russom et al. |
| 2006/0192225 A1 | 8/2006 | Chua et al. |
| 2007/0012940 A1 | 1/2007 | Suh et al. |
| 2007/0057249 A1 | 3/2007 | Kim et al. |
| 2007/0096127 A1 | 5/2007 | Pattison et al. |
| 2007/0252132 A1 | 11/2007 | Kamins et al. |
| 2008/0061304 A1 | 3/2008 | Huang et al. |
| 2008/0160725 A1 | 7/2008 | Byun et al. |
| 2009/0045416 A1 | 2/2009 | Bierhuizen et al. |
| 2009/0101897 A1 | 4/2009 | Murphy et al. |
| 2009/0140272 A1 | 6/2009 | Beeson et al. |
| 2009/0229097 A1 | 9/2009 | Crandlemire |
| 2009/0291237 A1 | 11/2009 | Park et al. |
| 2009/0315054 A1 | 12/2009 | Kim et al. |
| 2010/0019693 A1 | 1/2010 | Hoogzaad et al. |
| 2010/0019697 A1 | 1/2010 | Korsunsky et al. |
| 2010/0163894 A1 | 7/2010 | Uemura et al. |
| 2010/0252103 A1 | 10/2010 | Yao et al. |
| 2010/0317132 A1 | 12/2010 | Rogers et al. |
| 2011/0037094 A1 | 2/2011 | Lin et al. |
| 2011/0151602 A1 | 6/2011 | Speier |
| 2011/0156070 A1 * | 6/2011 | Yoon .................... H01L 33/42 |
| | | 257/98 |
| 2011/0198653 A1 | 8/2011 | Cho |
| 2011/0204327 A1 | 8/2011 | Hiruma et al. |
| 2011/0254043 A1 | 10/2011 | Negishi et al. |
| 2011/0263054 A1 | 10/2011 | Yu et al. |
| 2011/0291115 A1 | 12/2011 | Kim et al. |
| 2012/0012622 A1 | 1/2012 | Sundbaum |
| 2012/0126229 A1 | 5/2012 | Bower |
| 2012/0223289 A1 | 9/2012 | Gwo et al. |
| 2012/0223873 A1 | 9/2012 | Ohta |
| 2012/0261642 A1 | 10/2012 | Bergenek et al. |
| 2013/0063413 A1 | 3/2013 | Miyake |
| 2013/0063815 A1 | 3/2013 | Kubota |
| 2013/0082624 A1 | 4/2013 | Brassfield et al. |
| 2013/0119424 A1 | 5/2013 | Kang et al. |
| 2013/0154498 A1 | 6/2013 | Missbach |
| 2013/0208273 A1 | 8/2013 | Dominguez-Caballero et al. |
| 2013/0249972 A1 | 9/2013 | Nishino et al. |
| 2013/0256708 A1 | 10/2013 | Jin et al. |
| 2013/0328066 A1 | 12/2013 | Sabathil et al. |
| 2014/0008677 A1 | 1/2014 | Zhu et al. |
| 2014/0111559 A1 | 4/2014 | Yang et al. |
| 2014/0131753 A1 | 5/2014 | Ishida et al. |
| 2014/0159064 A1 | 6/2014 | Sakariya et al. |
| 2014/0231841 A1 | 8/2014 | Wang |
| 2014/0319560 A1 | 10/2014 | Tischler |
| 2014/0340900 A1 | 11/2014 | Bathurst et al. |
| 2015/0018609 A1 | 1/2015 | Forsell |
| 2015/0103070 A1 | 4/2015 | In et al. |
| 2015/0103404 A1 | 4/2015 | Rudy et al. |
| 2015/0162560 A1 | 6/2015 | Chen et al. |
| 2015/0186099 A1 | 7/2015 | Hall |
| 2015/0187991 A1 * | 7/2015 | McGroddy ............ H01L 24/75 |
| | | 257/13 |
| 2015/0207399 A1 | 7/2015 | Li et al. |
| 2015/0213756 A1 | 7/2015 | Wacyk |
| 2015/0221835 A1 | 8/2015 | Tischler et al. |
| 2015/0280086 A1 | 10/2015 | Jang et al. |
| 2015/0293302 A1 | 10/2015 | Czornomaz et al. |
| 2015/0325598 A1 | 11/2015 | Pfeuffer et al. |
| 2016/0013167 A1 | 1/2016 | Sakariya et al. |
| 2016/0155892 A1 | 6/2016 | Li et al. |

(56) References Cited

U.S. PATENT DOCUMENTS

| | | |
|---|---|---|
| 2016/0172253 A1 | 6/2016 | Wu et al. |
| 2016/0185277 A1 | 6/2016 | Cho et al. |
| 2016/0240159 A1 | 8/2016 | Ohkawa et al. |
| 2016/0315218 A1 | 10/2016 | Bour et al. |
| 2016/0341942 A1 | 11/2016 | Cheon et al. |
| 2016/0351539 A1 | 12/2016 | Bower et al. |
| 2017/0005151 A1 | 1/2017 | Kim et al. |
| 2017/0061878 A1 | 3/2017 | Park et al. |
| 2017/0069681 A1 | 3/2017 | Lee et al. |
| 2017/0082263 A1 | 3/2017 | Byrnes et al. |
| 2017/0084775 A1 | 3/2017 | Li et al. |
| 2017/0170360 A1 | 6/2017 | Bour et al. |
| 2017/0179097 A1 | 6/2017 | Zhang et al. |
| 2017/0179192 A1 | 6/2017 | Zhang et al. |
| 2017/0186740 A1 | 6/2017 | Cok et al. |
| 2017/0186908 A1 | 6/2017 | Robin et al. |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0338372 A1 | 11/2017 | Teraguchi et al. |
| 2017/0345867 A1 | 11/2017 | Chaji et al. |
| 2017/0352309 A1 | 12/2017 | Chang et al. |
| 2017/0352313 A1 | 12/2017 | Miyake |
| 2017/0371087 A1 | 12/2017 | You et al. |
| 2018/0005562 A1 | 1/2018 | Lin et al. |
| 2018/0012540 A1 | 1/2018 | Hosoyachi et al. |
| 2018/0024412 A1 | 1/2018 | Kim et al. |
| 2018/0033767 A1 | 2/2018 | Yu et al. |
| 2018/0033768 A1 | 2/2018 | Kumar et al. |
| 2018/0075798 A1 | 3/2018 | Nho et al. |
| 2018/0084614 A1 | 3/2018 | Bower et al. |
| 2018/0090058 A1 | 3/2018 | Chen et al. |
| 2018/0097033 A1 | 4/2018 | Ahmed et al. |
| 2018/0114878 A1* | 4/2018 | Danesh ............... H01L 25/50 |
| 2018/0138071 A1 | 5/2018 | Bower et al. |
| 2018/0180249 A1 | 6/2018 | Yamada et al. |
| 2018/0182298 A1 | 6/2018 | Jang et al. |
| 2018/0211595 A1 | 7/2018 | Takahashi et al. |
| 2018/0211945 A1 | 7/2018 | Cok et al. |
| 2018/0219144 A1 | 8/2018 | Perkins et al. |
| 2018/0226386 A1 | 8/2018 | Cok |
| 2018/0233536 A1 | 8/2018 | Chang |
| 2018/0247586 A1 | 8/2018 | Vahid et al. |
| 2018/0269234 A1 | 9/2018 | Hughes et al. |
| 2018/0275410 A1 | 9/2018 | Yeoh et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0323178 A1 | 11/2018 | Meitl et al. |
| 2018/0331258 A1 | 11/2018 | Halbritter et al. |
| 2018/0342492 A1 | 11/2018 | Lu et al. |
| 2018/0358339 A1 | 12/2018 | Iguchi |
| 2018/0358340 A1 | 12/2018 | Wong et al. |
| 2018/0367769 A1 | 12/2018 | Greenberg |
| 2019/0012957 A1 | 1/2019 | Liu et al. |
| 2019/0012965 A1 | 1/2019 | Fu et al. |
| 2019/0013439 A1 | 1/2019 | Sung et al. |
| 2019/0044023 A1 | 2/2019 | Cheng et al. |
| 2019/0058081 A1 | 2/2019 | Ahmed et al. |
| 2019/0066571 A1 | 2/2019 | Goward |
| 2019/0066587 A1 | 2/2019 | Han |
| 2019/0113199 A1 | 4/2019 | Pellarin et al. |
| 2019/0113727 A1 | 4/2019 | Tamma |
| 2019/0115508 A1 | 4/2019 | Lin et al. |
| 2019/0137757 A1 | 5/2019 | Rousseau |
| 2019/0148606 A1* | 5/2019 | Racz ................. H01L 33/54 257/98 |
| 2019/0165209 A1 | 5/2019 | Bonar et al. |
| 2019/0174079 A1 | 6/2019 | Anthony et al. |
| 2019/0195466 A1 | 6/2019 | Shimizu et al. |
| 2019/0198716 A1 | 6/2019 | Gordon et al. |
| 2019/0229097 A1 | 7/2019 | Takeya et al. |
| 2019/0235234 A1 | 8/2019 | Hu et al. |
| 2019/0235677 A1 | 8/2019 | Liu et al. |
| 2019/0258346 A1 | 8/2019 | Cheng et al. |
| 2019/0293939 A1 | 9/2019 | Sluka |
| 2019/0302917 A1 | 10/2019 | Pan |
| 2019/0305035 A1 | 10/2019 | Cho et al. |
| 2019/0305036 A1 | 10/2019 | Ahn et al. |
| 2019/0305185 A1 | 10/2019 | Lauermann et al. |
| 2019/0335553 A1 | 10/2019 | Ahmed et al. |
| 2019/0347979 A1 | 11/2019 | Ahmed |
| 2019/0371777 A1 | 12/2019 | Iguchi |
| 2019/0378674 A1 | 12/2019 | Chou et al. |
| 2019/0383474 A1 | 12/2019 | Vasylyev |
| 2019/0393198 A1 | 12/2019 | Takeya |
| 2020/0052033 A1 | 2/2020 | Iguchi |
| 2020/0105184 A1 | 4/2020 | Shao et al. |
| 2020/0119233 A1 | 4/2020 | Dupont |
| 2020/0134624 A1 | 4/2020 | Zhang et al. |
| 2020/0203580 A1 | 6/2020 | Marutani |
| 2020/0219855 A1 | 7/2020 | Chen et al. |
| 2020/0227594 A1 | 7/2020 | Kuo |
| 2020/0251638 A1 | 8/2020 | Morris et al. |
| 2020/0342194 A1 | 10/2020 | Bhat et al. |
| 2020/0343230 A1 | 10/2020 | Sizov et al. |
| 2020/0356016 A1 | 11/2020 | Sampayan et al. |
| 2020/0357103 A1 | 11/2020 | Wippermann et al. |
| 2020/0366067 A1 | 11/2020 | David et al. |
| 2021/0005775 A1 | 1/2021 | Chen et al. |
| 2021/0005782 A1 | 1/2021 | Ting et al. |
| 2021/0043617 A1 | 2/2021 | Onuma et al. |
| 2021/0104574 A1 | 4/2021 | Behringer et al. |
| 2021/0124247 A1 | 4/2021 | Mezouari et al. |
| 2021/0134624 A1 | 5/2021 | Zhang |
| 2021/0136966 A1 | 5/2021 | Jang et al. |
| 2021/0242370 A1 | 8/2021 | Lee et al. |
| 2021/0272938 A1 | 9/2021 | Chang et al. |
| 2021/0313497 A1 | 10/2021 | Pourquier |
| 2021/0325594 A1 | 10/2021 | Meng et al. |
| 2021/0375833 A1 | 12/2021 | Lee et al. |
| 2021/0391514 A1 | 12/2021 | Koyama et al. |
| 2021/0405276 A1 | 12/2021 | Brick et al. |
| 2022/0052235 A1 | 2/2022 | Biebersdorf et al. |
| 2022/0093833 A1 | 3/2022 | Takiguchi et al. |
| 2022/0102583 A1 | 3/2022 | Baumheinrich et al. |
| 2022/0123046 A1 | 4/2022 | Behringer et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |
| 2022/0375991 A1 | 11/2022 | Behringer et al. |

FOREIGN PATENT DOCUMENTS

| | | |
|---|---|---|
| DE | 19911717 A1 | 9/2000 |
| DE | 10009782 A1 | 9/2001 |
| DE | 102005063159 A1 | 7/2007 |
| DE | 102006045702 A1 | 4/2008 |
| DE | 102007043877 A1 | 1/2009 |
| DE | 102007046339 A1 | 4/2009 |
| DE | 102012008833 A1 | 11/2012 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |

(56) References Cited

FOREIGN PATENT DOCUMENTS

| | | |
|---|---|---|
| EP | 2396818 A2 | 12/2011 |
| EP | 2430652 A1 | 3/2012 |
| EP | 2477240 A1 | 7/2012 |
| EP | 2506321 A1 | 10/2012 |
| EP | 2609624 A2 | 7/2013 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 3367374 A1 | 8/2018 |
| JP | S62269385 A | 11/1987 |
| JP | 64-002386 A | 1/1989 |
| JP | 06-244457 A | 9/1994 |
| JP | 11-145519 A | 5/1999 |
| JP | 2002-246647 A | 8/2002 |
| JP | 2004-228297 A | 8/2004 |
| JP | 2005244220 A | 9/2005 |
| JP | 2005346066 A | 12/2005 |
| JP | 2006-263932 A | 10/2006 |
| JP | 2007-264610 A | 10/2007 |
| JP | 2007-324416 A | 12/2007 |
| JP | 2009141254 A | 6/2009 |
| JP | 2009-186794 A | 8/2009 |
| JP | 2009260357 A | 11/2009 |
| JP | 2010272245 A | 12/2010 |
| JP | 2012-510716 A | 5/2012 |
| JP | 2013048282 A | 3/2013 |
| JP | 2013110154 A | 6/2013 |
| JP | 2014019436 A | 2/2014 |
| JP | 2014-110333 A | 6/2014 |
| JP | 2015-099238 A | 5/2015 |
| JP | 2016-174179 A | 9/2016 |
| JP | 2016208012 A | 12/2016 |
| JP | 2017152655 A | 8/2017 |
| JP | 2017-533453 A | 11/2017 |
| JP | 2017535966 A | 11/2017 |
| JP | 2018-050082 A | 3/2018 |
| JP | 2018063975 A | 4/2018 |
| JP | 2018-191006 A | 11/2018 |
| JP | 2019009438 A | 1/2019 |
| JP | 2019029473 A | 2/2019 |
| KR | 10-0713226 B1 | 5/2007 |
| KR | 10-2011-0075279 A | 7/2011 |
| KR | 10-2013-0052944 A | 5/2013 |
| KR | 10-2014-0009923 A | 1/2014 |
| KR | 10-1798134 B1 | 11/2017 |
| WO | 2004/084318 A1 | 9/2004 |
| WO | 2006/035212 A1 | 4/2006 |
| WO | 2007/001099 A1 | 1/2007 |
| WO | 2009/082121 A2 | 7/2009 |
| WO | 2010/019594 A2 | 2/2010 |
| WO | 2010/132552 A1 | 11/2010 |
| WO | 2010/149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2016/151112 A1 | 9/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2018/192322 A1 | 10/2018 |
| WO | 2018179540 A1 | 10/2018 |
| WO | 2019/079383 A1 | 4/2019 |

OTHER PUBLICATIONS

Volz et al., "Influence of annealing on the optical and structural properties of dilute N-containing III/V semiconductor heterostructures," Journal of Crystal Growth, Jan. 2007, vol. 298, pp. 126-130.

Notice of Allowance in U.S. Appl. No. 17/475,030, mailed Jun. 15, 2022, 42 pages.

Buljan et al., "Ultra-Compact Multichannel Freeform Optics for 4xWUXGA OLED Microdisplays", Digital Optics for Immersive Displays Proc. SPIE, vol. 10676, 2018, 9 pages.

Fortuna, Seth, "Integrated Nanoscale Antenna-LED for On-Chip Optical Communication", UC Berkeley, 2017, 146 pages.

Huang et al., "Metasurface holography: from fundamentals to applications", Nanophotonics, vol. 7, No. 6, 2018, pp. 1169-1190.

Li et al., "Waveguiding in Vertical Cavity Quantum-Well Structure Defined by Ion Implantation", J. Lightwave Technol., vol. 16, No. 8, 1998, pp. 1498-1508.

Mertens, Ron, "More details emerge on Samsung's QD-OLED TV Plans", Oled-info, Available on internet at: <https://www.oled-info.com/more-details-emerge-samsungs-qd-oled-tv-plans>, Dec. 8, 2018, 4 pages.

Ogihara et al., "1200 Dots-Per-Inch Light Emitting Diode Array Fabricated by Solid-Phase Zinc Diffusion", IEICE Transactions on Electronics, vol. 80, No. 3, 1997, pp. 489-497.

Peng et al., "Magnetic-Mechanical-Electrical-Optical Coupling Effects in GaN-Based LED/Rare-Earth Terfenol-D Structures", Advanced Materials, vol. 26, 2014, pp. 6767-6772.

Stevens et al., "Varifocal technologies providing prescription and VAC mitigation in HMDs using Alvarez lenses", Digital Optics for Immersive Displays, Proceedings of the SPIE, vol. 10676, 2018, 18 pages.

Tomioka et al., "Selective-area growth of III-V nanowires and their applications", Journal of Materials Research, vol. 26, No. 17, Sep. 14, 2011, pp. 2127-2141.

Waldern et al., "Digilens Switchable Bragg Grating Waveguide Optics for Augmented Reality Applications", Digital Optics for Immersive Displays Proc. SPIE, vol. 10676, 2018, 17 pages.

Wheelwright et al., "Field of View: Not Just A Number", Digital Optics for Immersive Displays Proc. SPIE, vol. 10676, 2018, 8 pages.

Yu et al., "Hybrid LED Driver for Multi-Channel Output with High Consistency", IEEE 11th International Conference on ASIC (ASICON), 2015, 4 pages.

\* cited by examiner

LED MODULE, LED DISPLAY MODULE AND METHOD OF MANUFACTURING THE SAME

This patent application is a 35 U.S.C. § 371 National Phase of PCT Application No. PCT/EP2020/058124, filed Mar. 24, 2020, which claims the priority of German application DE 10 2019 110 500.5 dated Apr. 23, 2019, the priority of German application DE 10 2019 125 875.8 dated Sep. 25, 2019, and the priority of international application PCT/EP2020/052191 dated Jan. 29, 2020, the disclosures of which are hereby incorporated by reference.

BACKGROUND

The present invention relates to electronic components, and there in particular to horizontal light-emitting diodes, i.e. components which are contacted horizontally on a substrate or carrier.

Optoelectronic components, but also other electronic components in general, are used for a variety of different applications. In the field of optoelectronic components there are besides display applications in the consumer, professional or automotive area further applications, e.g. video walls, illuminants and the like. These applications differ with regard to the design and size of the components, even if the electrical parameters are similar. For this purpose, the optoelectronic components are usually built and further processed as discrete devices or in modules. Accordingly, the optoelectronic components in question have so far often been manufactured and optimized specifically for the application in question, so that their use in other applications has been costly or other disadvantages have had to be accepted.

Recently, there has also been a demand, particularly in the automotive and consumer sectors, to integrate sensors in addition to optoelectronic components in order, for example, to be able to record a user's bio- or vital parameters. Until now, these have been installed as separate components in the consumer product. However, the additional openings required for this, for example in a housing, or additional apertures are no longer desired.

In this context, DE 10 2018 119 376 discloses a display for displaying optical information, comprising a carrier, wherein a plurality of optoelectronic components are arranged side by side on the carrier, the components being configured to emit visible electromagnetic radiation from a first side of the carrier, wherein at least one optical sensor is provided on the carrier to receive electromagnetic radiation incident on the first side of the carrier.

The above-mentioned requirements and specifications lead to the demand for a uniform chip architecture and an identical or easily variable size of components for the above-mentioned applications and uses.

SUMMARY OF THE INVENTION

For the production of an arrangement with several optoelectronic components also called light emitting diodes or LEDs it seems to be appropriate to use during processing Subunits of components or LEDs to separate them in order to be able to process them further. This means that the subunits can be tested individually. If components or LEDs in the subunits fail, only the subunit needs to be replaced, not the entire application. The same applies to a display with several subunits. Here, too, only the subunit with the defective component needs to be replaced, but not the entire display. Secondly, by adapting a process step, manufacturing can be made more flexible so that different sizes can be produced. This approach is particularly suitable as a modular architecture for LEDs.

According to one aspect of modular architecture, a method for manufacturing device modules, in particular LED modules, is proposed comprising the steps:

Generating at least one layer stack providing a base module on a carrier;

Applying a first contact to a surface area of the layer stack facing away from the carrier;

Applying a second contact to a surface area of a first layer facing away from the carrier.

In this way, at least one layer stack providing a base module is provided, comprising a first layer formed on a support, on which an active transition layer is formed, and on which a second layer is formed To do this, the following steps can be taken:

Exposing a surface area of the first layer facing away from the carrier;

Connecting a first contact to a surface area of the second layer facing away from the carrier;

Connecting a second contact to the surface area of the first layer facing away from the carrier.

Accordingly, then, a device module, in particular LED module comprises at least one layer stack providing a base module, having a first layer formed on a carrier, on which a transition active layer is formed and on which a second layer is formed, a first contact being connected to a surface region of the second layer facing away from the carrier, a second contact being connected to a surface region of the first layer facing away from the carrier.

In this way, a base module can be created as the basic module of a component module with, in particular, a contact level for the contacts. By component module is meant, among other things, an optoelectronic component module, or a light-emitting diode or LED module. However, the invention is not limited to this, but various electronic modules can be used.

The base module is part of a larger system, but in turn may comprise one LED in its simplest form. In one aspect, the base module includes multiple, at least two LEDs. These may be individually controlled or may be constructed as a redundant form. According to a building block or modular principle, a division of a whole into parts, referred to as modules, can thus be made. With a rectangular or other arbitrary shape and a common function of light emission, the modules can be easily joined together.

In one aspect, the starting point is an LED, with horizontal architecture. The size of this optoelectronic component is designed to meet the requirements of or for a particularly demanding application, e.g. with regard to emission area, current carrying capacity or temperature stability. In order to meet the requirements of other applications as well, the LED architecture is designed in such a way that by a simple adaptation of a process step, namely with regard to the use of a different mask for layer stacking or mesa structuring, light emitting diodes can be produced which consist of several subunits of these components or LEDs.

For example, the basic size for a base module is in the range of 100 µm×100 µm to 500 µm by 500 µm. In addition to square sizes, other shapes such as rectangles or hexagons can also be used. With the mask and suitable contacting or separation, it would be just as easy to produce a component with 100 µm×200 µm or 300 µm×300 µm, which in turn is suitable for various other applications. As mentioned above, a component comprises one or more base modules, which in turn may comprise one or more components.

The modular design with the smallest required component as the base unit or base module, with the possibility of transforming this into a larger component with a multiple of the dimensions of the base unit, the base module, by only a minor adjustment in the processing, saves resources in the development and opens up a certain freedom in the production of such components. If, for example, applications in the LED field with a different brightness or pixel spacing are required, it is relatively easy to produce the chips needed for this.

In one aspect, not only the mesa (layer stack) is structured differently, but also a contact layer. Although two steps are varied for this purpose, it is no longer necessary to ensure that all contact pads are connected. By using a horizontal chip architecture, further process steps for n-contact bonding, such as with the vertical chip after mounting on the target carrier, can be avoided. This can simplify manufacturing and thus reduce costs compared to other manufacturing techniques.

According to a further aspect, the second contact may be formed by means of a dielectric to the transition layer and to the second layer electrically insulated to and extending on the surface region of the second layer facing away from the carrier.

Depending on the application requirements, base modules are implemented as a matrix along an X-Y plane along at least one row and along at least one column, with base modules of a respective row being oriented identically. Base modules of two adjacent rows are oriented the same way if necessary. In this way, an electrical series connection of base modules can be easily implemented.

Alternatively, the base modules of two adjacent rows are oriented in opposite directions, thus placing identical contacts adjacent to each other. In this way, an electrical parallel connection of base modules is easily realized. Since both contacts for n and p are located on the bottom side of horizontal components, it is expedient to arrange the chips in rows alternately. In this way, it is achieved that in a 2×X configuration of the chip, the contacts for the p side for both base elements are located in the center of the chip, and the n contacts are located on the outside in each case, thus minimizing a potential short-circuit risk.

In some aspects, a release of the at least one light emitting diode module from the plurality of base modules is performed by means of deep mesa structuring through the first layer, particularly from the side of the second layer. It may be performed using laser liftoff, from the side of a carrier facing away from the module. Likewise, an etching process would be conceivable.

Another aspect deals with the question of whether and to what extent such Subunits with sensor can be provided with sensors. In some applications, for example for displays or automotive applications, it may be useful to provide sensors to detect reactions or other parameters of a user directly in front of the display. For example, photo sensors could be used to detect the direction of gaze or a change in the direction of gaze. Likewise, the amount of light can be detected to brighten or darken an image, for example. Proximity sensors can be easily implemented that, for example, activate a display or other application in response to a detected person. The same sensors can be used with displays in automotive applications. Likewise, sensors that detect a driver's alertness to initiate action, if necessary, in response to detected drowsiness are possible. Vital parameters of a user can also be determined in this way without having to provide additional openings in a housing.

The inventors recognized that future displays may no longer feature sensors that are placed outside the display. Rather, the intention is to enable the functionality of sensors behind or within a full-surface display as an alternative to previous separate solutions. The division into basic modules and their combination disclosed here is used to create larger units. Redundant places for components can be equipped with sensors instead of the originally intended components. In relation to a display or a videowall, for example, this means that components for individual pixels or subpixels are omitted or replaced by sensors.

According to a first aspect, therefore, a display device comprising a target matrix formed on a first support or end support is proposed. The display device has locations that can be occupied by optoelectronic components or LEDs. In addition, a number of components, in particular LEDs, are formed on a second carrier or substitute carrier, so that a start matrix having the same spacing of locations which can be occupied by components as the target matrix is produced. In a subsequent step, the components are grouped on the second carrier to form a number of modules, and these modules are separated from the second carrier and arranged on the first carrier. This arrangement is carried out in such a way that the modules are positioned and electrically connected to the first carrier in the target matrix in such a way that a number of positions unoccupied by components remain in the latter. In at least some unoccupied positions, at least one sensor element is positioned and electrically connected. In some aspects, the occupiable locations of the target matrix correspond to subpixel locations or pixel locations.

Furthermore, the modules or subunits of optoelectronic components disclosed in this application are now provided. Their size or spacing corresponds to the corresponding parameters of the occupiable locations of the target matrix. The subunits are grouped into modules and positioned and electrically contacted on the target matrix in such a way that a number of locations unoccupied by components remain in the latter. At least one sensor element is positioned and electrically connected in each of these, at least in part. Thus, modules or sub-units are positioned on a display module or a display so that some places remain unoccupied, which can thus be equipped with sensors. Thus, the sensors become part of the display device. This has several advantages. For example, light falling on the display can be measured directly and then the illuminance of the module or even individual LEDs can be adjusted depending on the location.

According to another aspect, a method of manufacturing a display device is proposed. This has a target matrix with locations formed on a first carrier or end carrier and fillable with components arranged in rows and columns. The occupiable locations may correspond to subpixels in the case of a display device. Further, the locations exhibit a size and spacing substantially corresponding to the modules disclosed herein. In other words, the target matrix includes locations arranged in rows and columns and occupiable by modules of optoelectronic devices.

The modules are now produced as disclosed here, for example with shallow and deep mesa etching, and grouped into modules. The modules thus produced are removed from the replacement carrier and positioned at the vacant locations on the target matrix on the final carrier and electrically connected to the final carrier. During this process, however, previously defined locations are left blank. These are then each occupied by at least one sensor element, which is positioned and electrically connected.

The end carrier may include lead connections for the modules on components and, for example, the individual LEDs. Furthermore, in some aspects, the end carrier also includes at least one power source and/or drive electronics for the applied modules or the components. In yet another aspect, the end support further comprises electronics for reading the at least one sensor element. The at least one sensor element may comprise a photosensor. Further examples can be found in the following description.

The prepared modules or subunits on LEDs and the corresponding area of the target matrix on the final carrier must be screened identically or have the same size and, if applicable, the same periodicity. The spacing should be the same, especially if larger modules with multiple rows or columns are transferred and applied to the final carrier.

In one aspect, one or more contact areas of a module or subunit are congruent to a relevant contact area of occupiable locations on the final carrier. Thus, the modules can be installed in the target matrix on the end carrier. The modules can thus be inserted or integrated into the target matrix on the end carrier.

It is thus possible to construct a display device in which the modules, in particular the LED modules, are arranged with the same spacing from one another for all components. Thus, in one aspect, a target matrix of a display device is populated with a very small spacing between the populatable locations. In this aspect, each occupiable location can be populated with the smallest module to be fabricated. This results in a display device that allows a very high resolution due to the small size of the pixels and the small spacing, and due to which the display device can be brought very close to an eye of a user.

Alternatively, it is possible to further space apart the occupiable sites of the target matrix. Similarly, in some aspects, a plurality of the subunits disclosed herein may be arranged on such an occupiable site. In some aspects, the locations of the target matrix arranged in rows or columns may each be spaced apart by a distance b. The modules containing the devices each have the same size and a distance a from each other. Distance a may be equal to distance b, which is substantially the same as the above embodiment. However, distance b can also be a multiple of distance a. Since occupiable locations also include contact areas for the module or subunit, the available space also becomes larger, if the distance b between occupiable locations is larger. In this way, larger modules can be used or several modules can be combined. For example, if the distance b is 2.5 times the distance a, a module composed of 4 individual modules can be placed on an occupiable location and there is still a distance between the modules placed on adjacent locations.

By means of this embodiment, different applications can be taken into account. The smaller the distances a and b are in the case of a display device, the higher the resolution, the less sensitive the eye of a viewer can be. As a result, the same modules can be used to implement different display devices with different pixel or sub-pixel sizes and pixel pitches. This may be advantageous in that modules of such devices can be manufactured independently of the target matrix, its carrier and its wiring.

The already disclosed shallow mesa etch, which is used for the electrical contacting of the pixels and the formation of the modules and the target matrix and in which etching is performed in the grid, is combined with a so-called deep etch, in which the chip grid and the modules can then be defined. This chip grid can be different from a pixel chip grid depending on the application. For example, 2×2 large chips with 4 subpixels each (4 base units) could then be produced for a display device. A base unit is in each case an optoelectronic component or an LED. By suitable designing the mask for the second mesa etch, one could likewise create pixels each comprising one base unit less. When these pixels are lined up, the result is a display with "holes" the size of a base unit or multiples thereof. Various sensors, for example, can then be placed under these "holes" or "missing subpixels". By combining them, subpixels with redundancy are possible, whereby in some cases the redundant subpixel is replaced by the sensor.

For this purpose, it is expedient that optoelectronic components or light-emitting diodes with a uniform chip architecture and an identical or easily variable size of the chips are provided for the manufacture of displays. The techniques described herein can be used for this purpose. For example, in creating modules of the type disclosed, it is possible to use the cover electrode disclosed in this application, or even the circumferential structure, to increase light output. In some aspects, the modules may subsequently be further processed, for example by applying a photoelectric structure. However, it should also be mentioned at this point that the modules can be provided with such a structure already in their manufacturing process.

In some aspects, the devices are combined into rectangular or square modules, which in turn can be combined in any manner, particularly into rows. By fabrication using shallow and deep etch, wafers can be prepared from such modules, which can then be singulated as needed for the target matrix. In this way, modules of different sizes can be realized. The free positioning makes it possible to leave specific areas unoccupied. Likewise, groups of cells or even entire rows or columns can be left unoccupied. Finally, these modules can be used to implement display devices or other applications whose target matrix has a different arrangement of occupiable locations, e.g. not in rows and columns.

According to one embodiment for a display device, at least one module may have four pixel elements in two rows and two columns. Each pixel element may comprise one or more subpixels. In another embodiment, a module may have four subpixel elements also arranged in a 2×2 matrix. This is a simple to handle embodiment. According to yet another embodiment, at least one module may have two rows and two columns, but only three components. This is an easy-to-handle embodiment in which an unoccupied position is already provided with the module.

In a further embodiment for a display device, at least seven modules with four pixel elements each and at least two modules with three pixel elements each can be positioned and electrically connected in the target matrix on the end carrier in such a way that at least two locations unoccupied by pixel elements are created, at which at least one sensor element is positioned and electrically connected in each case. Here, the modules can be configured as desired and linked to one another on the end carrier or positioned against one another in such a way that specific unoccupied locations can be generated. Again, the pixel elements either comprise several sub-pixel elements and corresponding LEDs or each pixel element is a LED.

According to a further embodiment, the positions occupied by sensor elements can be framed by components. In this way, well-defined positions, unoccupied by components, can be explicitly provided for sensor elements. In some aspects, the modules can be generated to be arranged in subpixels. Modules emitting in different colors can be provided on different second carriers or substitute carriers.

According to various embodiments, a plurality of sensor elements may be formed as part of a sensor device formed on the first support or end support to receive electromagnetic radiation incident on a first side of the first support. In this way, different radiation spectra can be detected depending on the use. According to a further embodiment, a sensor element may be formed as a photodiode, in the form of a phototransistor, in the form of a photoresistor, in the form of an ambient light sensor, in the form of an infrared sensor, in the form of an ultraviolet sensor, in the form of a proximity sensor, or in the form of an infrared device. Likewise, the sensor may be a vital sign sensor that detects a vital sign parameter. Thus, the display device can be used in a variety of ways. For example, a vital sign may be body temperature.

In a further embodiment, the vital sign monitoring sensor may be disposed within a display screen or behind the rear surface of a display screen, wherein the sensor is arranged to measure one or more parameters of a user. In addition to a body temperature, this parameter may include, for example, eye gaze direction, pupil size, skin resistance, or the like.

According to a further embodiment, a device may have a respective first layer formed on a carrier, on which a transition active layer is formed, and on which a second layer is formed.

A first contact is connected to a surface area of the second layer facing away from the carrier, and a second contact is connected to a surface area of the first layer facing away from the carrier. This embodiment corresponds to a vertical LED. In this way, the devices can be contacted from only one side. In further aspects thereto, the second contact may be electrically insulated from the transition layer and from the second layer by means of a dielectric extend along a surface region of the second layer remote from the carrier.

DESCRIPTION OF THE FIGURES

In the following, the invention is explained in detail with reference to several drawings by means of embodiment examples.

DETAILED DESCRIPTION

The following embodiments relate primarily to display devices and displays, and thus to basic units and modules of optoelectronic devices. However, the present invention is not limited to this application or to the devices illustrated. Rather, the principles and embodiments presented can be generalized so that they are suitable for a variety of electronic applications and uses where scaling, i.e., a combination of like components, is necessary.

Figure 1:
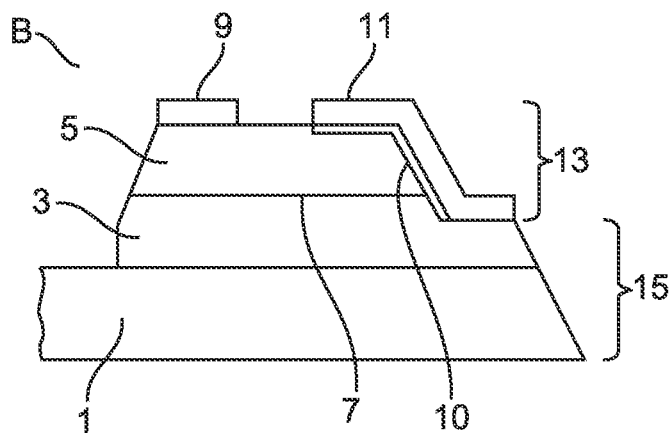
FIG. 1 shows an embodiment of a proposed base module for providing light emitting diode modules according to some aspects of the proposed concept.

FIG. 1 shows a modular architecture of components of the same type using optoelectronic components or LEDs. FIG. 1 shows various horizontal LEDs combined in so-called base modules for providing LED modules. The base module comprises a layer stack, which has a first layer 3 formed on a carrier or replacement carrier 1, on which an active layer 7 is formed and on which a second layer 5 is formed. A first contact 9 is applied to a surface region of the second layer 5 remote from the carrier 1, and a second contact 11 is connected to a surface region of the first layer 3 remote from the carrier 1. The second contact 11 is electrically insulated from the active layer 7 and from the second layer 5 by means of a dielectric 10 and is formed extending to and on the surface region of the second layer 5 facing away from the carrier 1.

During the manufacture of the base module, a surface area of the first layer 3 facing away from the carrier 1 is exposed after the layer stack has been created. That is, material of the second layer 5, the active layer 7 and partially of the first layer 3 is removed again at an edge region of the layer stack.

This can be carried out, for example, by means of a mesa structuring of the at least one layer stack, in particular from the side of the second layer 5, whereby a trench surrounding the at least one layer stack is created in particular in a mesa structuring area 13. The trench is also referred to as a mesa trench. The flanks of a layer stack are accordingly called mesa flanks. This structuring is carried out by means of corresponding masks.

In the case of mesa structuring, areas etched away, in particular by means of inductively coupled plasma ICP or reactive ion etching RIE, can then be coated with an insulating layer or a dielectric 10 by means of chemical vapor deposition (chemical deposition from the gas phase). SiO or ZnO can be used as dielectric. The second contact 11 can be ITO (indium tin oxide) and is produced by sputtering or physical vapor deposition.

In this way, a plurality of base modules is generated in the form of a matrix along an X-Y plane, i.e. along at least one row and along at least one column on a carrier 1. For this purpose, at the right edge region, in addition to the shallow mesa structuring, another, a deep mesa structuring is also implemented through the carrier 1 and the first layer 3. The area 15 corresponds to the deep flank structuring the deep mesa structuring allows a module to be removed from a matrix of a plurality of base modules on a carrier 1. The deep mesa structuring can be carried out by means of etching, in particular dry chemical etching or plasma etching.

Figure 2:
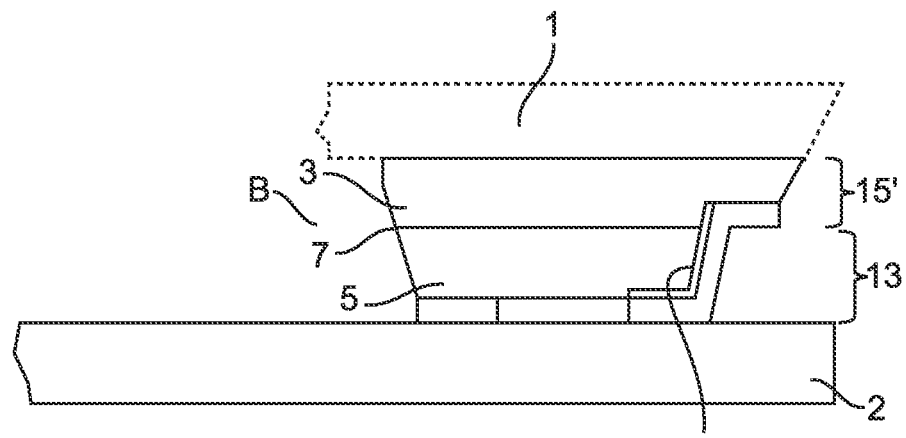
FIG. 2 shows the embodiment example according to FIG. 1 on a replacement carrier according to further aspects.

FIG. 2 shows an example of a base module B according to FIG. 1 arranged upside down on a further carrier or end carrier 2. The further carrier or end carrier 2 can be transparent to the light emitted by the optoelectronic component. In addition, the material of the carrier 1 has been removed. This can be carried out, for example, by means of grinding away or so-called laser lift-off (LLO). The base module B is thus arranged as a flip chip on the further carrier or end carrier 2 and contacted there.

Figure 3:
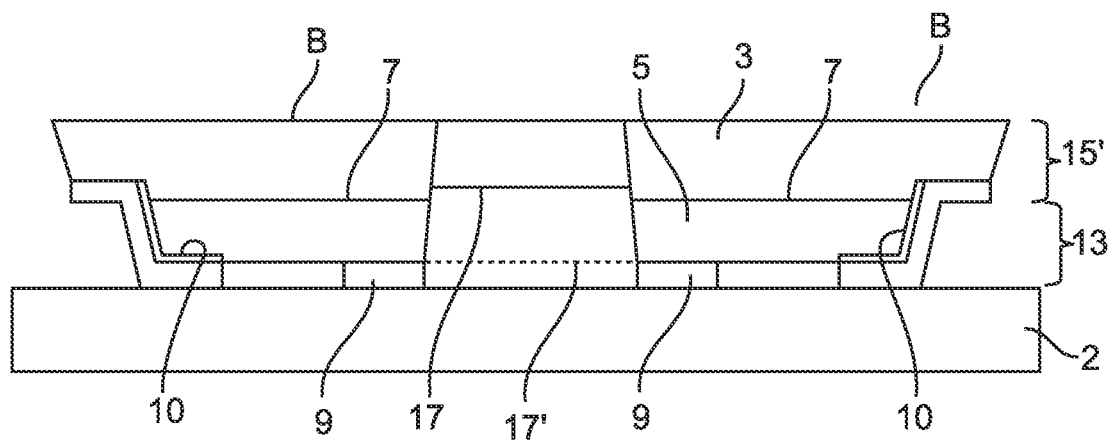
FIG. 3 illustrates the design example according to FIG. 2 with a further base module.

FIG. 3 shows the embodiment example according to FIG. 2 with a further base module B with flank area 15' without carrier 1.

Both base modules B are oriented opposite to each other, with identical contacts, namely first contacts 9, being arranged adjacent to each other. Both base modules B may have been originally formed on the carrier 1 in two adjacent rows of a matrix. After a removal of the carrier 1, the base modules B have been arranged upside down on another carrier or end carrier 2. The two adjacent base modules B oriented opposite to each other have been created here as a common stack of layers. In this case, the dashed line 17' in FIG. 3 would be a surface area of the second layer 5 midway between the two base modules. However, to prevent crosstalk, the layer 5 in the middle has been removed by means of structuring. After such structuring, which also cuts through the active layer, the solid line 17 shows a surface area of the first layer 3.

Figure 4:
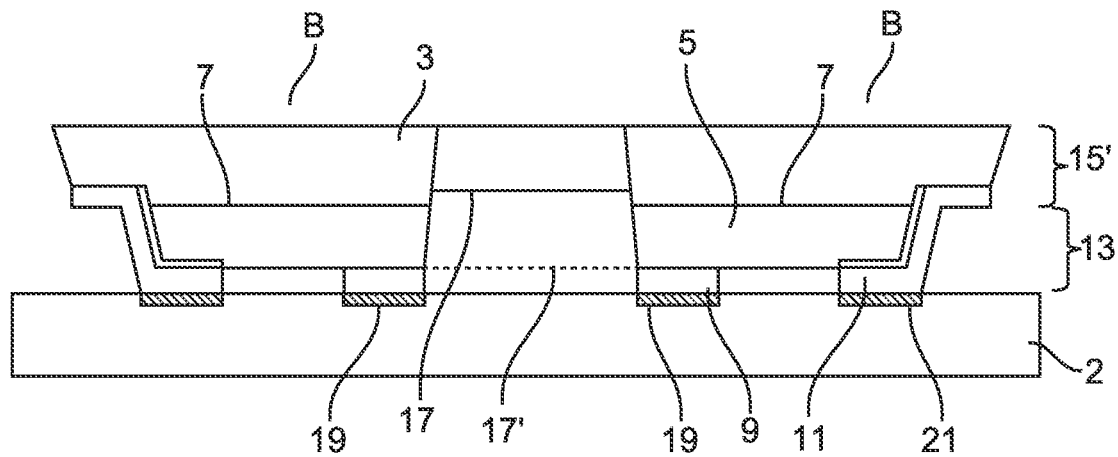
FIG. 4 shows the design example according to FIG. 3 with separate contacting of the contacts.

FIG. 4 shows the design example according to FIG. 3 with separate contacting of the contacts. First contacts 9 and second contacts 11 are electrically connected separately to corresponding contacts on the end carrier 2. A first contact 19 is electrically connected to the first contact 9 of each module and a second contact 21 is electrically connected to a second contact 11. The contacts 21 and 19 are made in previous steps in the end carrier 2. The base modules are then placed on the end carrier 2 to create an electrical connection.

As in the previous design, the center area is partially removed by additional structuring. Alternatively, it can also remain.

Figure 5:
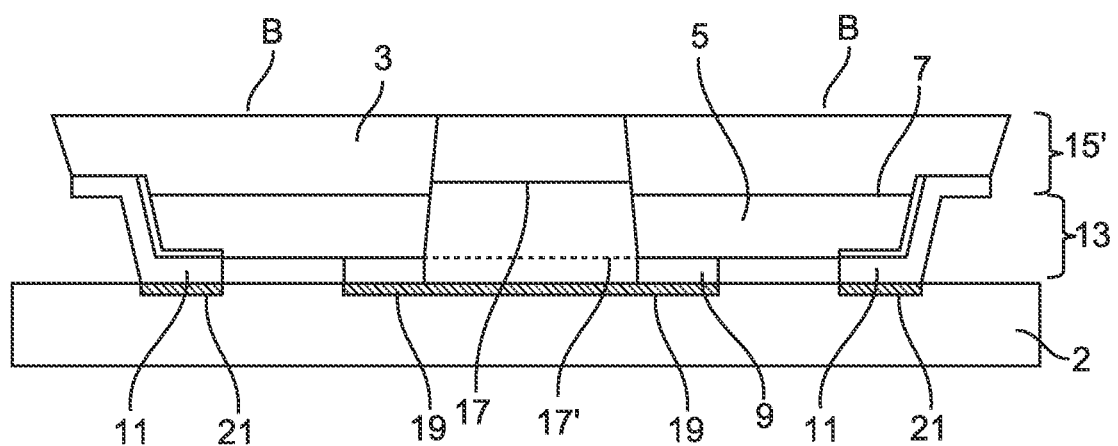
FIG. 5 illustrates the embodiment example according to FIG. 4 with common contacting of the first contacts.

FIG. 5 shows the example according to FIG. 3 with common contacts of the first contacts. Second contacts 11 are electrically connected separately to contacts of the end carrier 2. A first contact 19 applied to a surface of the end carrier 2 is electrically connected to two first contacts 9. Second contacts 21 are electrically connected separately to second contacts 11. As in the previous embodiment, the central area is partially removed by additional structuring. Alternatively, it can also remain in place.

Figure 6:
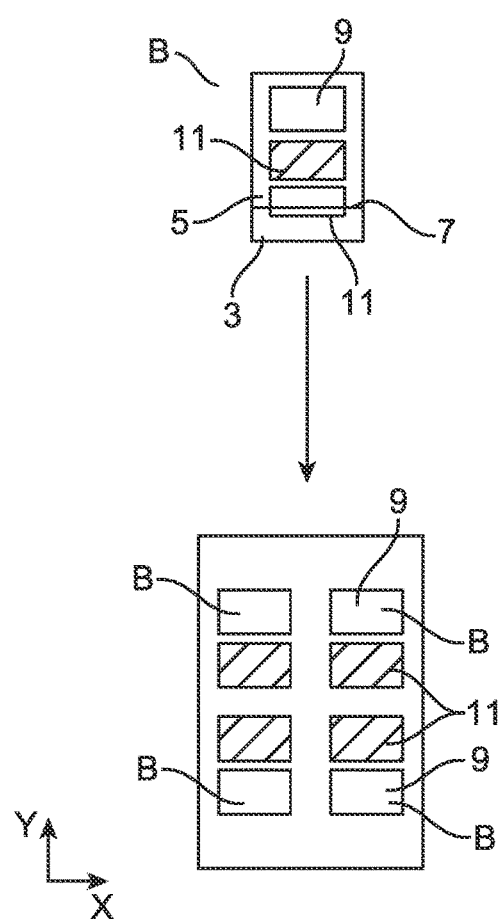
FIG. 6 shows another embodiment of a proposed base module for providing a light emitting diode module having two rows and two columns of base modules according to some aspects of the concept presented.

In principle, a first layer 3, a transition layer 7 and a second layer 5 can be completely removed in FIGS. 3 to 5 as a result of deep deep structuring between the two base modules B. The two base modules B can be contacted to the further carrier or end carrier 2 using flip-chip technology. FIG. 6 above shows another embodiment of a proposed base module B of a single LED for providing a module having two rows and two columns of base modules B shown below. The base module B shown above may be provided here on a carrier 1, but equally without a carrier. In this top view, a first contact 9 and a second contact 11 are visible, and additionally the first layer 3, the transition layer 7 and the second layer 5 are shown.

According to FIG. 6 below, four base modules B have been grouped into one module. Already on a carrier 1, this matrix may have been selected with two rows and two columns in an X-Y plane. When adjacent rows are produced on the carrier 1, the base modules B of a row can be oriented in the same way. In this case, the bottom row has base modules B that are oriented opposite to the top base modules B. The module shown at the bottom in FIG. 6 can still be arranged on the carrier 1 not shown after a shallow mesa structuring. Subsequently, a grouping into the rectangular light emitting diode module is carried out by selecting a release area. This is extracted by means of deep mesa structuring along a rectangle encompassing the module. The 2×2 (two rows by two columns) module created in this way has, for example, a width of approximately 400 micrometers and a length of approximately 600 micrometers.

FIGS. 7A to 7D show four cross-sections of two oppositely oriented base modules B which are arranged upside down, i.e. as flip chips, on a further carrier or end carrier 2. A base module B can have a width of approximately 200 micrometers and a length of 300 micrometers. Depending on masking during a mesa etch, in particular to provide a shallow flank structuring, precursors of component modules can be created which can subsequently be detached from a carrier, in particular carrier 1, to or as a light-emitting diode module, in particular by means of deep flank structuring. Reference character 10 denotes a dielectric.

Figure 7:
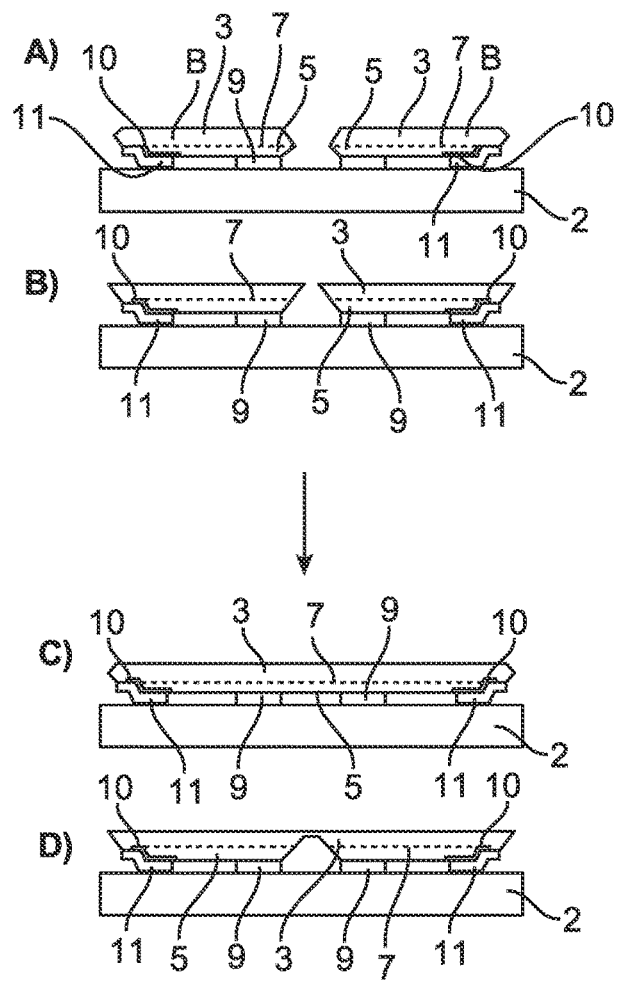
FIGS. 7A to 7D show four cross-sections of two oppositely oriented base modules of two adjacent rows.

According to FIG. 7A, two oppositely oriented individual base modules B are arranged adjacent to each other. Their first contacts 9 are adjacent to each other but do not touch. The cross-section according to FIG. 7A shows that a flat mesa structuring has been led out from the side of the second layer 5. This creates a shallow trench that runs around a respective base module B or a respective layer stack. Deep mesa structuring was carried out from the side of the first layer 3 so that the individual base modules are separated. As a result, several base modules still connected to each other are first placed on the end carrier 2 and then separated by means of the flank structuring from the side 3. The original carrier 1 was removed.

FIG. 7B also shows two oppositely oriented individual base modules B arranged adjacent to each other. Their first contacts 9 are adjacent to each other but do not touch. The cross-section according to FIG. 7B shows that a shallow mesa structuring of the layer stacks was carried out from the side of the second layer 5. In contrast to FIG. 7A, deep mesa structuring of the layer stacks is also carried out from the side of the second layer 5, i.e. from the same side as the shallow mesa structuring. The original carrier 1 was removed.

FIG. 7C shows an intermediate step. Thereafter, two oppositely oriented base modules B are arranged, which are generated together as one piece. Their first contacts 9 are adjacent to each other. A common layer stack of two adjacent oppositely oriented base modules is generated, wherein a first layer 3, a transition layer 7 and a second layer 5 have each been generated as one unit along the end beam 2. The cross-section according to FIG. 7C also shows that shallow mesa structuring of the layer stack has been carried out from the side of the second layer 5, with only the edge regions of the two second contacts 11 being shallowly mesa structured. The area between the two first contacts 9 is not mesa structured, i.e. the second layer 5 there remains unprocessed. After contacting, deep mesa structuring of the layer stack is carried out here as in FIG. 7A from the side of the first layer 3 and the modules are separated (not shown). The original carrier 1 is removed.

According to FIG. 7D, two oppositely oriented base modules B are also arranged, which have been produced together as one piece. Their first contacts 9 are adjacent to each other. A common layer stack of two adjacent oppositely oriented base modules has been created, whereby a first layer 3 has been created as a unit along the end beam 2. The cross-section according to FIG. 7D shows that a shallow mesa structuring of the layer stack has been carried out from the side of the second layer 5, whereby a shallow trench has been generated around a respective base module B. In particular, the area between the two first contacts 9 is mesa-structured, i.e. the second layer 5 there and the transition layer 7 as well as part of the first layer 3 have also been removed there as well as in the edge area of the second contacts 11. Deep mesa structuring of the layer stack was carried out here as in FIG. 7B from the side of the second layer 5. Only a small ridge remains in the image, but this can still be separated if necessary.

Figure 8:
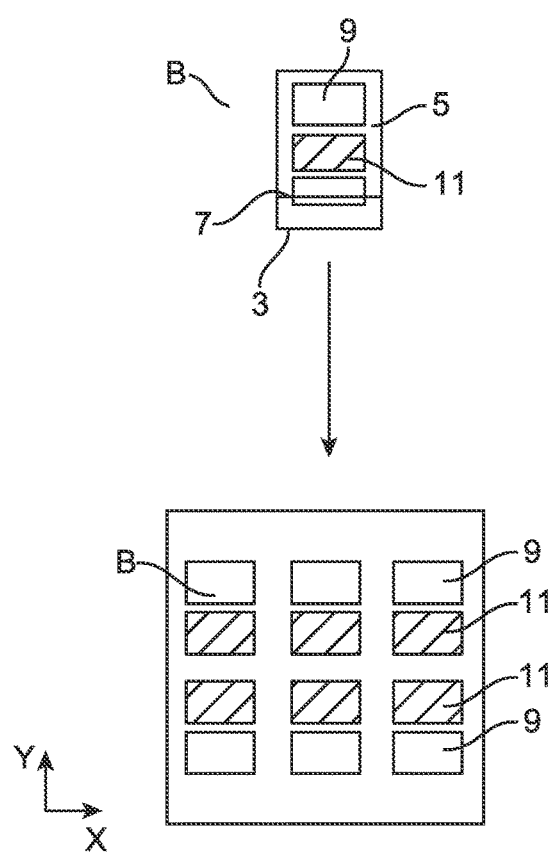
FIG. 8 shows another embodiment of a proposed base module for providing a light emitting diode module having two rows and three columns of base modules.

FIG. 8 shows another embodiment of a proposed base module B for providing a component module shown below having two rows and three columns (2×3) of base modules B. The base module B shown above may be provided here on a carrier 1, but equally without a carrier. In this top view, a first contact 9 and a second contact 11 are shown, and the first layer 3, the transition layer 7 and the second layer 5 are visible.

According to FIG. 8 below, six base modules B are grouped to form a component module. Already on a carrier 1, this matrix is selected with two rows and three columns in an X-Y plane. Moreover, when adjacent rows are produced on the carrier 1, the base modules B of a row are oriented in the same way. In this case, the lower row has base modules B arranged in the opposite direction to the upper base modules B. The component module shown in FIG. 8 below can still be arranged on the carrier 1 after a shallow mesa structuring. A grouping into the rectangular light emitting diode module shown below is performed by selecting a release area. This can be extracted by means of a deep mesa structuring along a rectangle encompassing the module. The generated 2×3 (two rows by three columns in an X-Y plane) device module has a width of approximately 500 micrometers and a length of approximately 500 micrometers. With this method, any combination of a matrix of basic modules can be extracted and produced as a module.

FIGS. 9A to 9D show four cross-sections of two oppositely oriented base modules B of a component module according to the lower illustration in FIG. 8.

Figure 9:
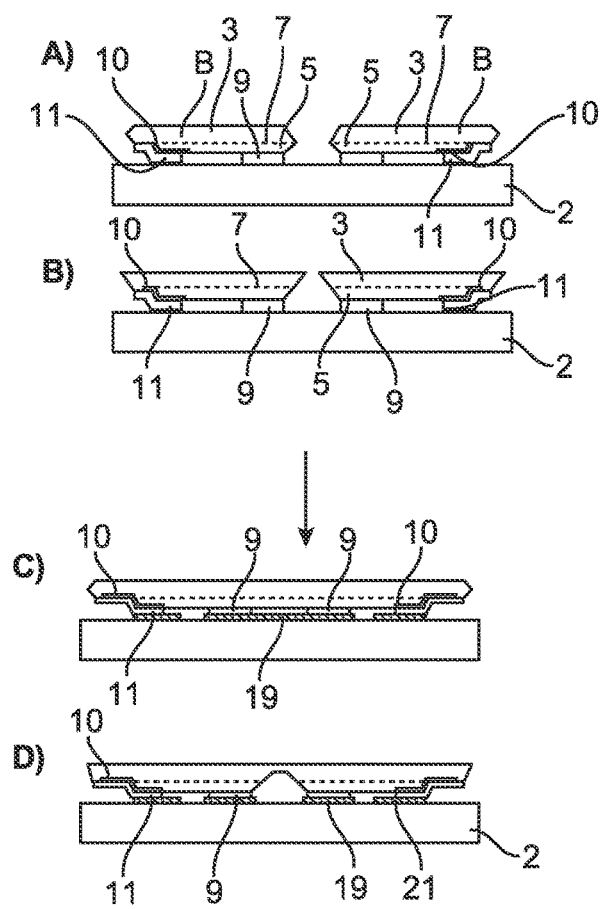
FIGS. 9A to 9D illustrate four cross-sections of two oppositely oriented base modules of two adjacent rows.

FIG. 9C shows, in contrast to FIG. 7C, that the first contacts 9 are electrically connected and contacted by means of a common first contact 19 created on the end carrier 2. The second contacts 11 are individually electrically connected to second contacts 21 of the end carrier 2. FIG. 9D shows, in contrast to FIG. 7D, that first contacts 9 are individually electrically connected to first contacts 19 and second contacts 11 are individually electrically connected to second contacts 21 of the end carrier 2.

Figure 10:
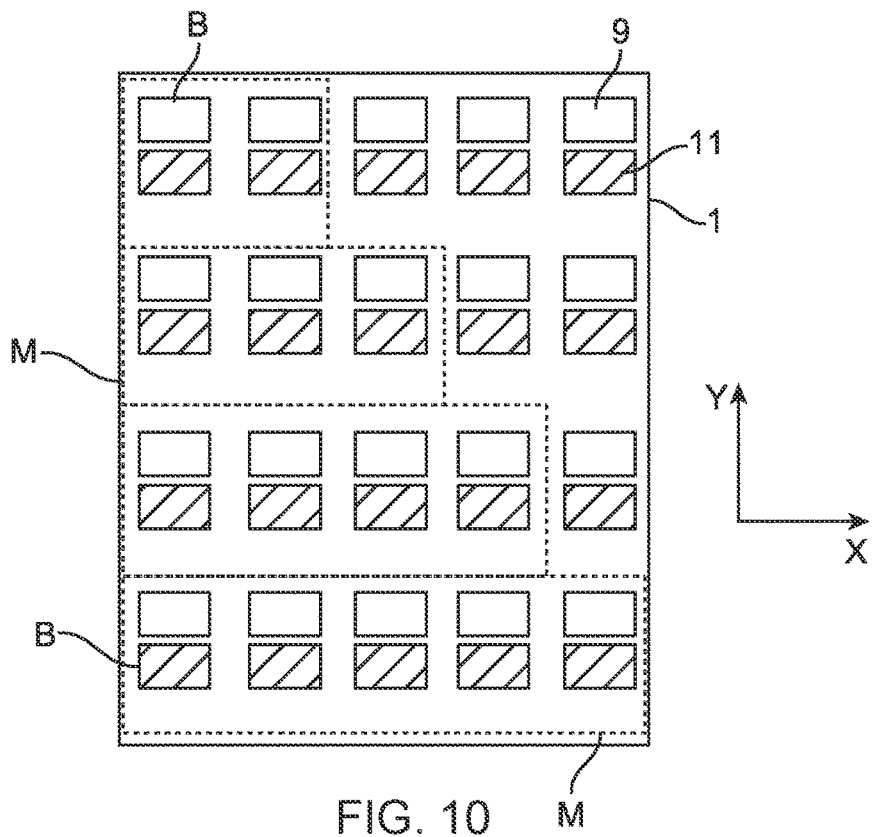
FIG. 10 shows a top view of a matrix comprising basic modules with groupings to explain further aspects.

FIG. 10 shows a top view of a matrix of base modules B of a carrier (wafer or carrier 1) with groupings in an X-Y plane. The base modules B are all originally generated on a carrier, in particular carrier 1, with the same orientation. There was no rotation or turning of base modules B. A respective module constructed in this way has here in a Y-direction only one base module B and is thus single-lined. In an X direction, any number of base modules can be provided. In FIG. 10, base modules B have been grouped to form four LED arrays or LED modules M.

Figure 11:
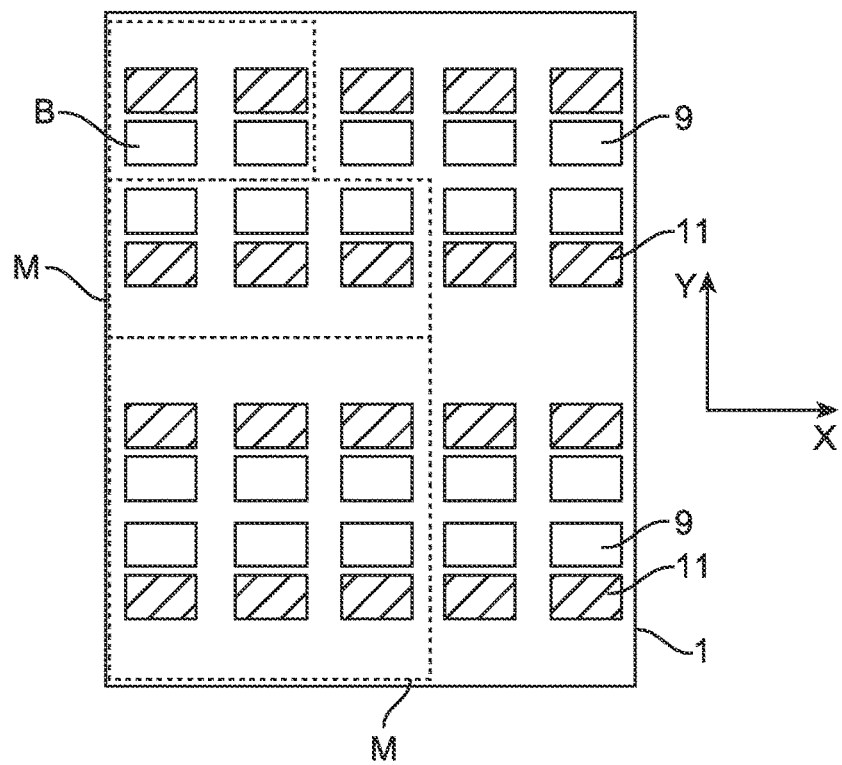
FIG. 11 illustrates a top view of a matrix comprising base modules with further groupings.

FIG. 11 shows a top view of a matrix of a carrier (wafer or carrier 1) with base modules B and other groupings. The base modules B of two adjacent rows are oriented opposite to each other by rotating the base modules B of one of these rows. The dotted lines represent the rectangles of the modules M still to be separated. FIG. 11 shows component modules M with one or two rows along a Y-direction, whereby the number of columns in the X-direction can be arbitrary.

Figure 12:
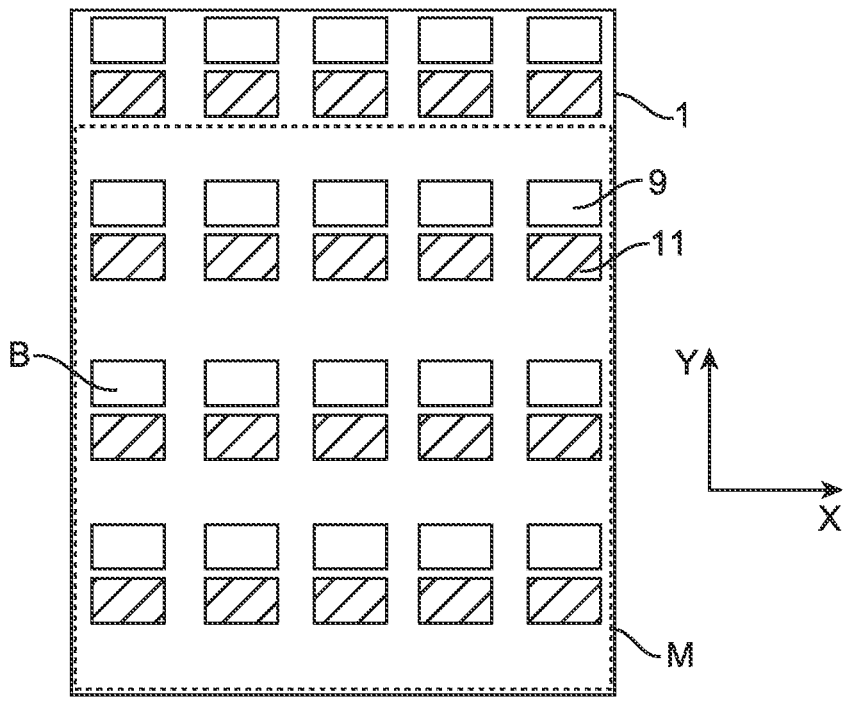
FIG. 12 shows a top view of a matrix comprising base modules with another possible grouping.

FIG. 12 shows a further top view of a further matrix of a carrier, in particular a carrier 1 or wafer, with a further grouping, comprising base modules B. This grouping creates in an X-Y plane a rectangular component module M in the form of an LED module which has three rows and five columns. The LED module M thus has 15 base modules B evenly distributed in the rectangle. The base modules B are equally spaced from each other along a row. Likewise, the rows are equally spaced from each other. All base modules B are oriented the same here.

Figure 13:
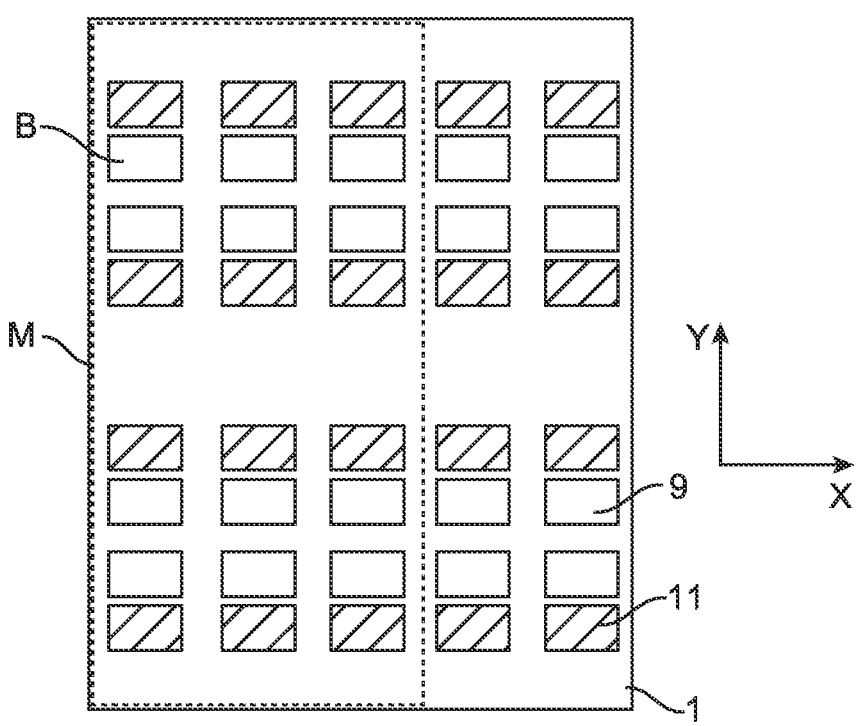
FIG. 13 is a top view of a matrix comprising base modules with another possible grouping.

FIG. 13 shows a further top view of a further matrix of a carrier, in particular a carrier 1 or wafer, with a further grouping, comprising base modules B. This grouping creates a rectangular LED module M in an X-Y plane, which has four rows and three columns. The LED module M here thus has 12 base modules B evenly distributed in the rectangle. The base modules B are equally spaced from each other along one row. The base modules B comprise two pairs of rows, where in one pair of rows the base modules B of both rows are oriented opposite to each other and are equally spaced from each other. The spacing of the pairs of rows from each other may be different from the spacing of the rows in a pair of rows. In this way, a chip cluster of optoelectronic devices or LEDs can be formed on a carrier 1 or wafer. This results in a modular architecture that can be used for various applications.

The manufactured modules M can be electrically contacted using flip-chip technology, for example, and integrated into display devices or illuminant walls or panels. Base modules B can be electrically connected in series or electrically connected in parallel.

Figure 14A:
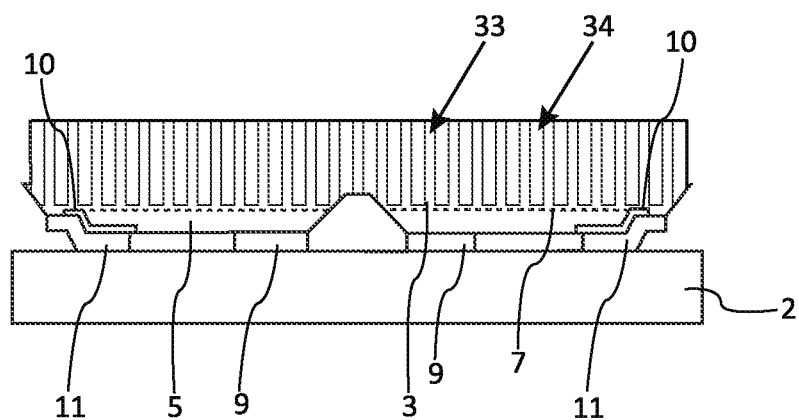
FIG. 14A illustrates a cross-sectional view of another embodiment of an LED module with an additional photonic structure.

FIG. 14A shows an embodiment in which the device module was patterned on the light emission side either after the intermediate transfer step or before. In this case, several periodically arranged holes were etched into the semiconductor layer facing the light emission side, which can be referred to as so-called negative pillars or columns. This results in a periodic variation of the refractive index, since the surrounding semiconductor material has a larger refractive index than the holes filled with air. In this embodiment, the depth of the periodic structure extends to approximately the active region, but is at least on the order of a wavelength of light to be emitted. In this embodiment, the holes in the semiconductor material are not filled. However, it may be useful to fill them with a material having a different refractive index in order to achieve the desired optical properties on the one hand and to obtain a planar surface on the other hand.

Figure 14B:
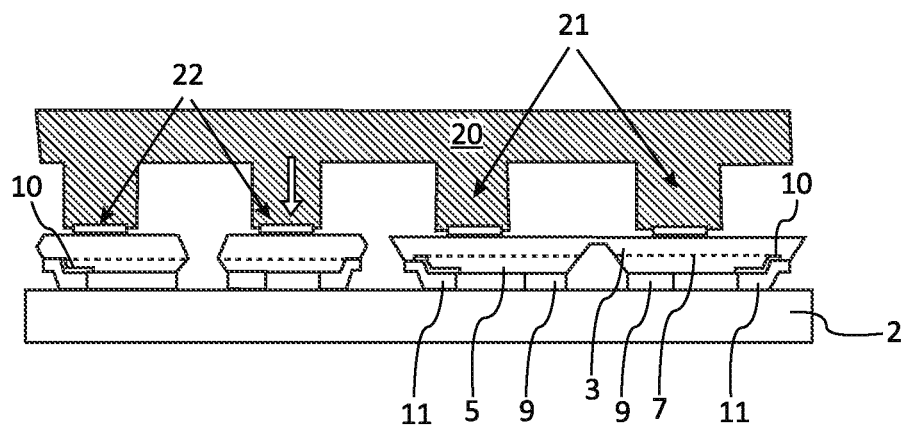
FIG. 14B illustrates an example of how a proposed module may be lifted off by a transfer die described in this application.

The component modules are to be transferred to a backplane after deep mesa structuring as well as after complete etching. The defined size of the components from the combined base modules is particularly suitable here, as it defines the spacing. In addition, a class of dies can possibly be used to transfer modules of different sizes. FIG. 14B illustrates an example of such a transfer process using a stamp, as described in further detail in this application. The stamp 20 has a plurality of pads 21 and 22 spaced at fixed intervals, each of which can be subjected to a surface tension or surface charge as described in this application. The spacing of the pads corresponds to the size of the individual base modules of each base module.

If a base module or a module composed of several base modules is now to be removed from the composite and transferred, the stamp generates a potential on its side facing the module so that it adheres to the pad. The adhesive force is determined by the charge or voltage of a pad. In this respect, even larger modules can be transferred, provided that the electrostatic force generated by the pads is sufficient.

Figure 15:
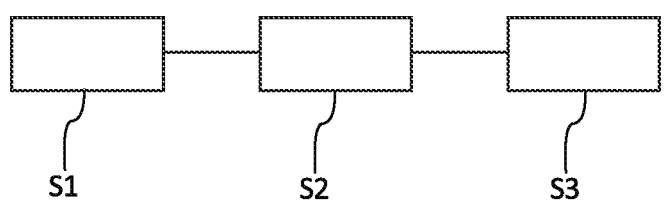
FIG. 15 shows several steps of an embodiment of a proposed method for manufacturing modules.

FIG. 15 shows an embodiment of a proposed process for manufacturing such component modules, which may be formed from optoelectronic components, for example. In a first step S1, at least one layer stack providing a base module is generated. This has a first layer formed on a carrier 1, to which an active layer is applied and to which a second layer is applied. The active layer may comprise a quantum well or the like. In a second step S2, a disclosure of a surface region of the first layer facing away from the carrier 1 is performed. Finally, in a third step, a first contact is applied to a surface region of the second layer facing away from the carrier 1. In addition, a second contact is made to the surface region of the first layer facing away from the carrier 1 and disclosed. The second contact is electrically insulated from the transition layer and the second layer by means of a dielectric and runs along the surface region of the second layer facing away from the carrier 1.

In this way, any number of base modules can be generated as a matrix on a wafer or carrier 1, whereby the base modules can be grouped into combined LED modules and these can then be separated. Such modules with optoelectronic components preferably have a rectangular or square shape in an X-Y plane of the matrix. In this, base modules can be regularly arranged with respect to each other in the rows and in the columns with equal spacing. The base modules are generated and arranged along the matrix preferably evenly distributed over a wafer, carrier or spare carrier 1.

The manufacturing process presented here is highly simplified. Rather, a variety of the techniques described herein can also be used. For example, each base module may have current constriction by appropriate doping of the change in band structure. In addition, since the base modules may be singulated, it is convenient to use quantum well intermixing or other measures to change the bandgap of the material system and the active layer at the potential breaking points. This reduces non-radiative recombination at possible edge defects, since the charge carriers experience repulsion due to the changed potential of the band structure. The fabricated modules can further be patterned in the surface to improve the radiation pattern. Thus, it is possible to apply a photonic crystal or a converter layer to larger modules or modules of different colors. Each LED module can also be provided with its own control, which has already been implemented in the final carrier 2.

Figure 16:
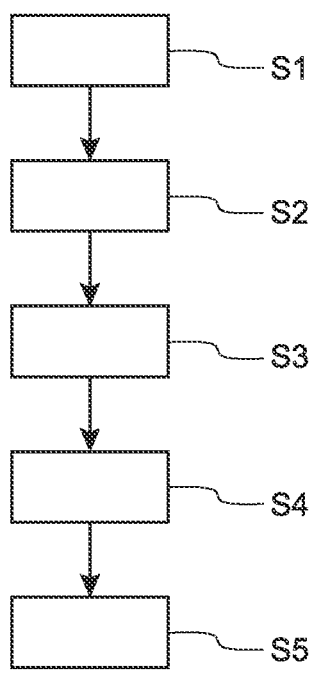
FIG. 16 illustrates a schematic diagram of another method of manufacturing modules according to some aspects of the proposed principle.

Another aspect deals with the question of whether and to what extent such Subunits with sensor en can be provided. As mentioned before, the manufactured and grouped modules are transferred to a target matrix, which is for example a backplane or the like. FIG. 16 shows the steps S1 to S5 of a proposed method for manufacturing a display device with such sensors, which is manufactured by means of the modules presented here. This method is only shown as an example in that other devices can also be manufactured using this method.

By means of the process, a display device is manufactured with a full-area target matrix of components, in particular LEDs 5, arranged next to each other in rows and columns on a first carrier 3 or end carrier. The optoelectronic components are in turn part of basic or combined modules.

In a first step S1, a number of components, e.g. LEDs 5, are formed on a carrier or a spare carrier 17 in a start matrix 7. The spacing and size of the LEDs 5 in the start matrix 7 are in a fixed, in particular integer, ratio to the spacing and size of the vacancies of the later target matrix 1 on the first carrier or end carrier 3. In particular, the wafer is prepared for deep mesa etching to obtain a module structure. The individual LEDS later form the subpixels or pixels on the target matrix. In this respect, the start matrix 7 can be congruent with at least a part of the target matrix 1. In this way, for this part, groups of components 5 can be transferred from the substitute carrier 17 to the final carrier 3. Accordingly, the replacement carrier with the LEDS formed thereon can be at least partially congruent with the end carrier with respect to the size and spacing thereof.

With a second step S2, the LEDs 5 are grouped into a number of modules 9 on the replacement carrier 17, in particular by means of deep mesa etching. In a subsequent step S3, the modules 9 structured in this way are lifted off the replacement carrier 17, in particular by means of laser lift-off or a mechanical or chemical process, and then transferred as modules to the final carrier 3 and thus to the target matrix 1. Contact areas of the modules contacting the LEDs 5 are designed to correspond to contact areas of the target matrix after transfer. In other words, for at least a partial area of the end carrier 3 and thus of the target matrix 1, the modules and the LEDs with their contact areas are arranged next to each other on the replacement carrier 17 in rows and columns in such a way that the distances between the LEDs 5 on the replacement carrier 17 are the same as the distances between the LEDs 5 on the target matrix 1 of the end carrier 3.

In the fourth step S4, the modules 9 are positioned and electrically connected to the primary end carrier 3 in the target matrix 1 in such a way that a number of unoccupied positions 11 remain in it. For this purpose, the modules themselves may be of uneven design, so that, for example, one module is missing. Alternatively, the modules can also be transferred to the target matrix in such a way that some places, for example rows or columns, remain unoccupied. In a fifth step S5, at least one sensor element 13 is positioned and electrically connected at each of the unoccupied locations 11, at least in part.

Figure 17A:
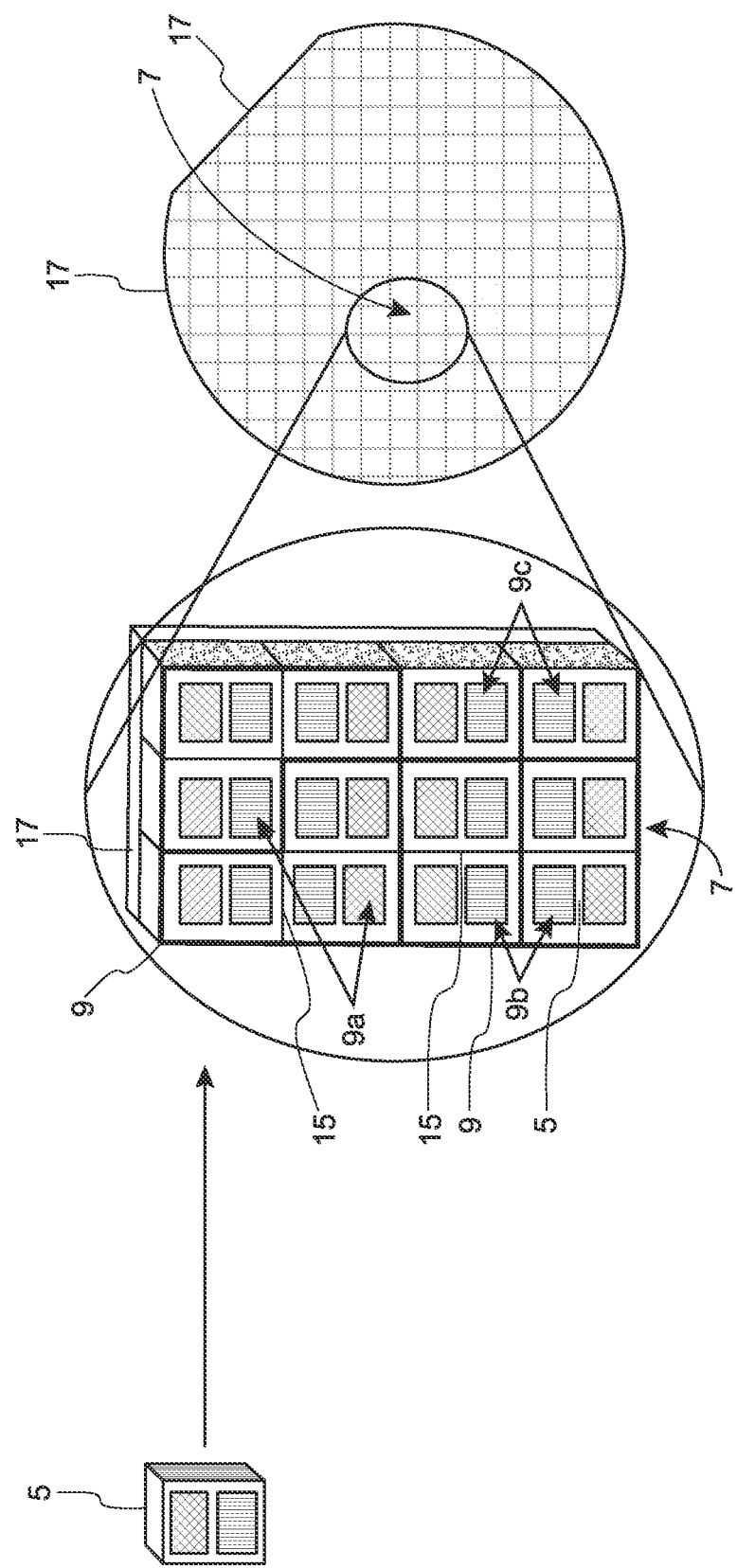
FIG. 17A are illustrations of some steps of the process presented in FIG. 16.

FIG. 17A shows a diagram illustrating the various aspects of and differences between the single device, module and the replacement carrier. The replacement carrier 17 comprises a sapphire substrate on which various semiconductor layers, including at least one active layer, have been deposited in several steps disclosed in this application. A start matrix 7 of LEDs is created on the replacement carrier 17 by means of a shallow etch. The components 5 e.g. LEDs 5 are still connected to each other and only have electrically isolating areas from each other created by means of shallow etching, so that they are individually addressable.

In one aspect, vertical LEDs are formed with a first contact facing the carrier and a second contact facing away from the carrier. However, in addition to this embodiment, LEDs or devices can also be manufactured that are formed as a flip chip with the contacts adjacent to each other on the same side. In the present example, an LED 5 is designed as a flip chip with the two contacts facing away from the carrier and electrically insulated from each other. The LED 5 form a cuboid-shaped element. The LED 5 represents a base element and has, for example, a width in the range of 100 µm×150 µm to 300 µm×450 µm. Other sizes or shapes e.g. hexagonal shape are also possible. A component 5 is shown as a base unit on the left side of FIG. 17A.

By means of a then additional, this time deep mesa etching—this corresponds to the second step S2 of FIG. 16—the LEDs 5 are grouped into modules 9. In the center of FIG. 17A, a start matrix 7 of twelve components 5 is created on the replacement carrier 17 by means of a shallow etching, whereby the LEDs 5 are arranged along common sides 15 in four rows and in three columns next to each other. The thick edges in the center of FIG. 17A surround grouped modules 9 in this way, which can group a plurality of components 5 together. In this way, two modules 9a are created, each grouping together three LEDs 5. Furthermore, two modules 9b with two LEDS each are generated as well as two modules 9c with one LED each.

Figure 17B:
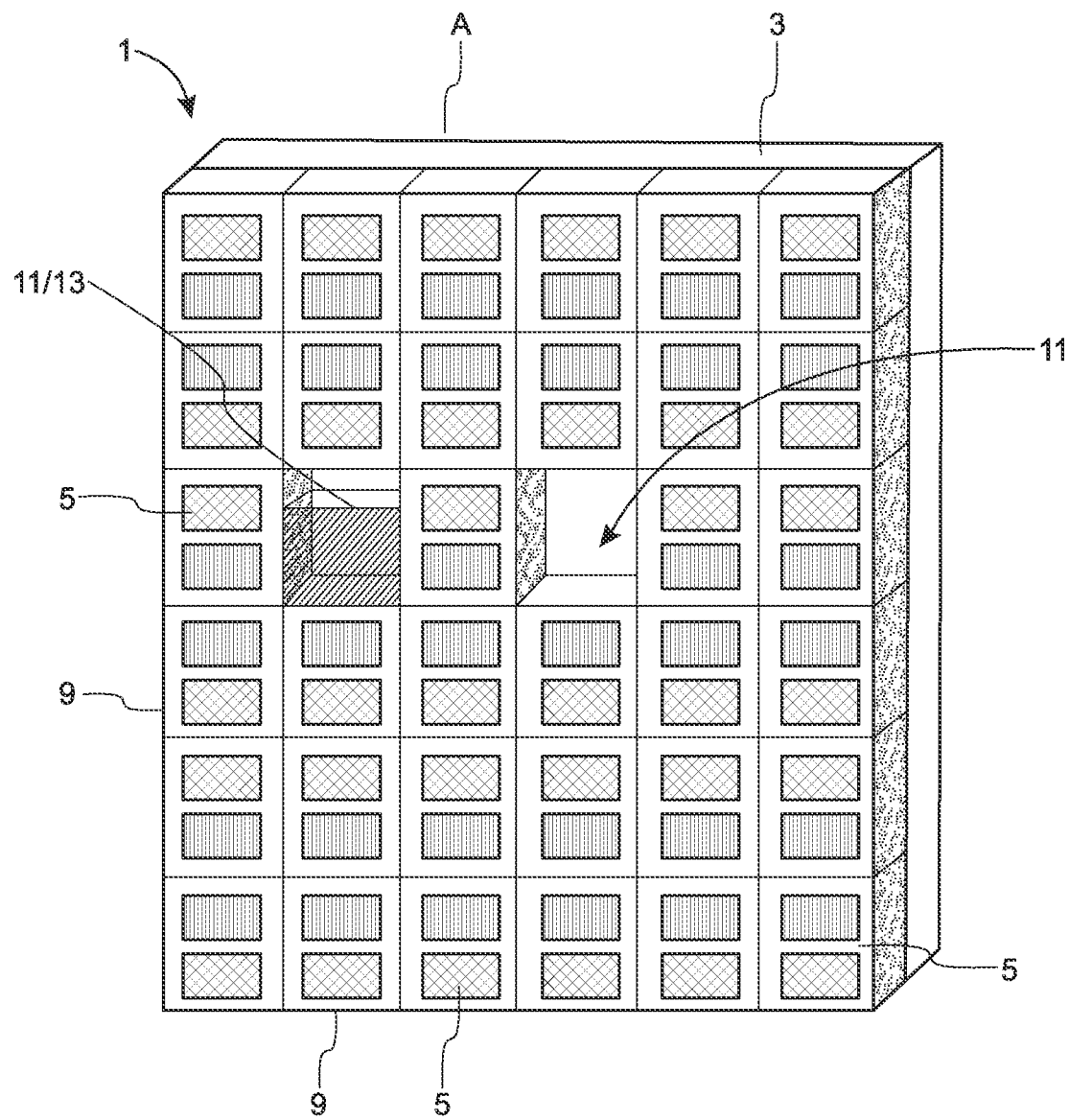
FIG. 17B shows an illustration of further steps of the process presented in FIG. 16 for an explanation of various aspects.

FIG. 17B shows a representation of the modules and LEDs after transfer to the end carrier 3. A total of 6 columns and rows can be seen on the end carrier 3, although the number can of course be selected as desired. The module arrangement is chosen so that there is no further spacing between the modules, i.e. the components are close together. However, modules are selected which do not fit completely into this matrix. For example, 2×2 modules could completely cover the end beam shown here. However, two modules are designed in such a way that they are not a 2×2 matrix but a 2×1 matrix, i.e. they have only three LEDs, so that one position 11 remains unoccupied. Thus, when positioned in the manner mentioned, two locations 11 remain vacant, the position of these again depending on the positioning of the respective module. The left of the two vacant positions is occupied by a sensor element 13. In the illustrated embodiment, only one position is already occupied. In embodiments, however, the sensor element can also consist of two individual or several elements, which are then divided between the unoccupied positions.

FIG. 17B thus shows a plurality of LEDs 5 grouped together in the form of modules 9 and arranged on the end carrier 3. In this way, a single full-surface target matrix 1 is equipped. For a display device such as a display, video wall or others, modules 9 are formed and grouped as subpixels. For this purpose, modules 9 for the three different colors red, green and blue are used and arranged next to each other in such a way that they as subpixels together form a pixel (picture element). Then the picture elements are arranged along the target matrix 1 in rows and columns. By using redundant LEDs, sensor elements can also be positioned at some places instead of redundant subpixels.

Figure 17C:
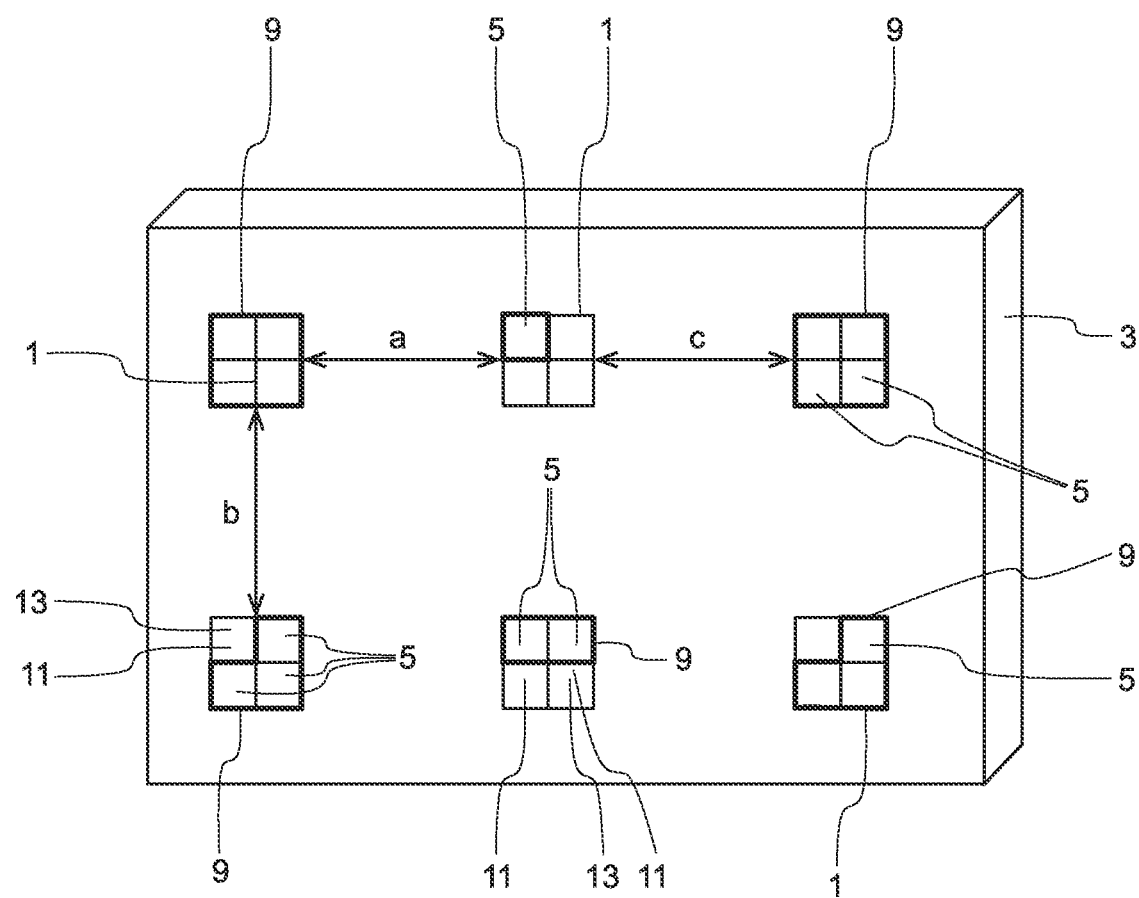
FIG. 17C shows an illustration of an arrangement of a plurality of whole-face target matrices.

FIG. 17C shows an illustration of an arrangement of a plurality of whole-area target matrices 1. In contrast to FIG. 17B, a plurality of whole-area individual target matrices 1 are used, each of which may also have a large number of modules 9 corresponding to FIG. 17B. For a clear description of FIG. 17C, a respective single whole-area target matrix 1 has only two rows and two columns. Here, the target matrices 1 have a uniform equal size in area. Alternatively, the target matrices 1 may generate differently sized areas. In this way, a display device can be flexibly adapted to a respective use.

Thus, in the upper left target matrix 1, a module 9 covers all occupiable locations of the target matrix 1. To the right of this, only one module 9 with one component 5 is formed in the target matrix 1, whereby three positions 11 remain unoccupied. Below this, two components 5 form a module 9, with two places 11 remaining unoccupied. A module 9 is positioned in the lower left of the target matrix 1, which consists of three building elements 5, with only one location 11 remaining unoccupied.

Sensor elements 13 may, for example, be formed at least in part at the unoccupied locations 11. Three of the four aforementioned target matrices 1 may each have components 5 for a color red, green and blue and together form a picture element. This picture element can be repeated horizontally and vertically along the first carrier or end carrier 3 so that a display function can be provided. Since a homogeneous radiation of the subpixels is basically desired, these are preferably equipped with the same modules 9 for each color. The fourth target matrix 1 can alternatively be designed as completely equipped with sensor elements 13.

The distances a and c for respective distances of the target matrices 1 in a row and the distance b as an example of a distance of the target matrices 1 in a column can be selected depending on the desired resolution of the display. This likewise applies to the distances to the edges of the first carrier or end carrier 3. The distances a and b, or a and c, or b and c or a, b and c may be the same. Likewise, the distances a and b and c can be whole multiples of the spatial extension of a component 5 or the spacing of the components 5 from one another.

Figure 17D:
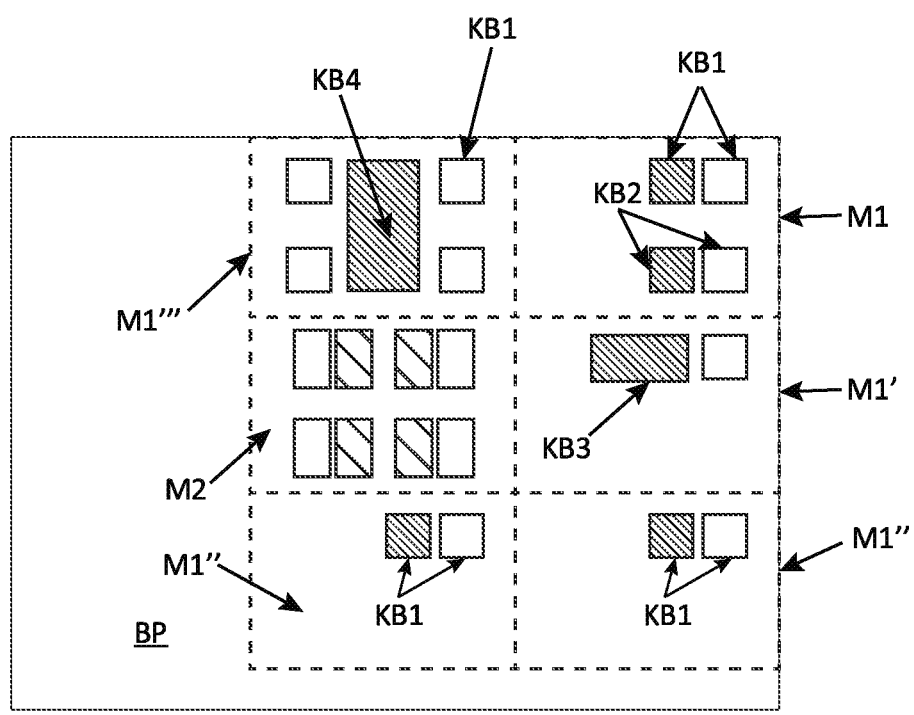
FIG. 17D is a schematic illustration of various contact surfaces suitable for contacting the proposed LED modules.

FIG. 17D shows examples of different contact options for electrical contacting of LED modules on a backplane or other carrier. M1 shows a contact panel M1 with two areas KB1 and KB2, which are suitable for two individual base modules, among others. The base modules can be placed on the surface individually or as a composite. Contact panel M1' has a larger contact area KB3. This allows to place one LED module consisting of two connected base modules with flat mesa etching and to control them together. Panels M1" are similar to panel M1', with only contact areas provided for one base module. Panel M2 illustrates an LED module placed over the contact areas. Panel M1" illustrates an area where a common connection is provided.

Figure 17E:
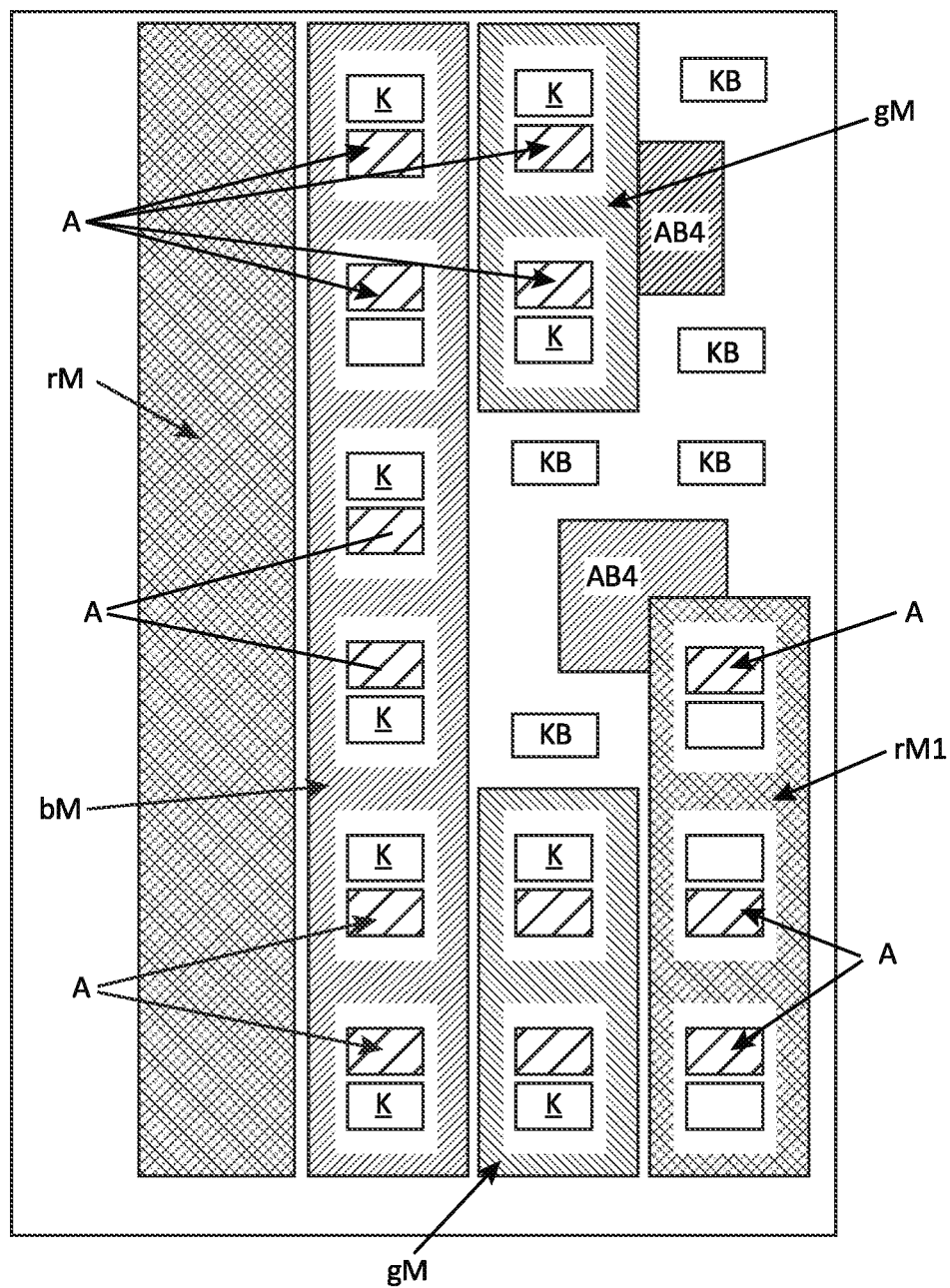
FIG. 17E shows a section of a display with contact areas and some modules.

FIG. 17E shows a section of a partially populated sheet or plane to illustrate some aspects of this. As already mentioned, the LEDs can be manufactured as an array in rows and columns. This allows the assembly of multiple LED modules and modules with different colors. This is shown in FIG. 17E. The detail shows a red module rM in direct top view. It is made of a 6×1 module according to the proposed principle and is applied and contacted on the plane. Adjacent to the red module is a blue module bM in a kind of sectional view to illustrate the various contacts. Contacts connected in common are denoted by K. The term "common" in this context is intended to mean that these contacts have the same potential with at least some other adjacent contacts. Accordingly, a common contact area AB4 is applied to the plane. As shown, this always contacts contacts K of several base modules. Further contacts Kb serve for individual control of each base module. Consequently, the formation of a total of 5 contact areas on the tarpaulin is necessary in order to be able to control 4 base modules individually. As shown, the shared contact areas can thus also be shared by LED modules of different colors.

Figure 18:
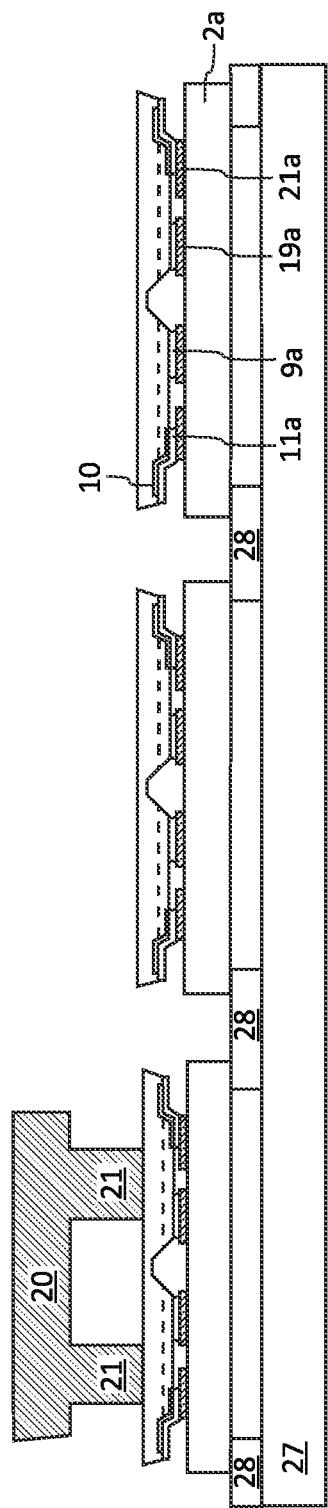
FIG. 18 shows an embodiment for a double transfer process with proposed modules.

Finally, FIG. 18 shows another aspect of the transfer process. By periodically arranging and organizing the LED modules into base modules, after singulating LED modules in the desired manner, the modules can be transferred using the dual transfer process presented in this application. FIG. 18 shows a transfer arrangement 20 with two pads 22 whose size corresponds to the spacing of the base modules.

Various methods, LED modules and LED display modules are now described with the accompanying items:

1. Method of manufacturing modules of LEDs, comprising the steps:
    Producing at least one layer stack providing a base module on a carrier comprising a first layer, an active layer formed thereon, and a second layer formed thereon;
    Exposure of a surface area of the first layer facing away from the carrier;
    Forming a first contact to a surface region of the second layer facing away from the carrier;
    Forming a second contact to the surface area of the first layer facing away from the carrier.

2. The method according to item 1, characterized in that forming a second contact comprises:
    Forming an electrically insulating dielectric over a portion of the active layer and the second layer;
    forming the second contact with a conductive material electrically contacting the remote surface region of the first layer over the dielectric to a surface region of the second layer remote from the carrier.

3. The Method according to item 1 or 2, characterized by Exposing the surface region of the first layer facing away from the carrier by means of a flat mesa structuring of the at least one layer stack, in particular from the side of the second layer, wherein in particular a flat trench is produced, surrounding the respective layer stack.

4. The method according to any one of the preceding items, characterized by Generating a plurality of base modules as a matrix along an X-Y plane along at least one row and along at least one column, wherein base modules of a respective row are oriented the same.

5. The method according to item 4, characterized in that the base modules of two adjacent lines are oriented the same way; or that the base modules of two adjacent rows are oriented in opposite directions, thereby arranging contacts of the same polarity, in particular first contacts, adjacent to each other.

6. The method according to item 5, characterized by Creating a common layer stack of two adjacent base modules oriented opposite to each other.

7. The method according to any one of the preceding items, characterized by at least one of the following steps:
    grouping a number of base modules into at least one LED module, in particular rectangular or square along the X-Y plane, wherein, in particular in the case of a plurality of rows, each row has the same columns occupied by base modules; and
    Forming the at least one LED module from the plurality of base modules by means of deep mesa structuring through the first layer, in particular from the side of the second layer.

8. The method according to any one of the preceding items, characterized in that the base modules are arranged on a different support when structuring the deep mesa, in contrast to exposing the first and second contacts.

9. The method according to any one of the preceding items, characterized by at least one of the following steps:
    Detachment of the base module or LED module from the carrier means laser lift-off; and
    Detachment of the base module or LED module from the carrier, by means of a mechanical process.

10. The method according to any one of the preceding items, characterized by Contacting the contacts of the LED module to a replacement carrier or end carrier, in particular using flipchip technology.

11. The method according to item 10, characterized in that common contact areas are created for contacts of adjacent oppositely oriented base modules of the LED module.

12. The method according to any one of the preceding items, characterized in that the first layer is n-doped and the second layer is p-doped, the active layer being designed in particular for the emission of blue or green light; and/or in that the first layer is p-doped and the second layer is n-doped, the active layer being designed in particular for the emission of red light.

13 The method according to any one of the preceding items, characterized in that the at least one layer stack is created by means of epitaxy; and/or in that exposure and/or grouping is carried out by means of etching.

14. The method according to any one of the preceding items, further comprising:
    Generating quantum well intermixing in regions of the active layer that extend adjacent to deep mesa structuring.

15. A LED module comprising at least one layer stack forming a base module, having a first layer formed on a carrier, an active layer and a second layer, wherein a first contact is formed in or on a surface region of the second layer remote from the carrier, and a second contact is formed in or on the surface region of the first layer remote from the carrier, the first and second contacts being spaced apart.

16. The LED module of item 15, wherein a light emitting surface is formed on a side of the layer stack opposite the first and second contacts.

17. The LED module according to item 15, characterized in that the second contact is formed by means of a dielectric electrically insulated to the transition layer and to the second layer and formed at the surface region of the second layer facing away from the support.

18. The LED module according to item 17, characterized in that the LED module comprises a plurality of base modules arranged in a matrix of at least one row and at least one column.

19. The LED module of item 18, wherein an LED adjacent to the LED module is separated by deep mesa structuring.

20. The LED module according to item 19, in which regions of the active layer which run adjacent to deep mesa structuring have an increased band gap produced in particular by quantum well intermixing.

21 The LED module according to any one of the preceding items, characterized in that the base modules of two adjacent rows are oriented in opposite directions so that contacts of the same polarity, in particular first contacts, are thus arranged adjacent to each other.

22. The LED module according to any one of the preceding items, characterized in that the module, in particular the light-emitting diode module, has been produced by means of a method according to one of the preceding items.

23. A LED display module with
a full-area target matrix formed on a first support and having rows and columns of LEDs, fillable locations,
One or more LED modules according to any one of items 15 to 22, comprising one or more base modules whose size corresponds to the occupiable locations;
characterized in that the LED modules are positioned and electrically connected to the first carrier in the target matrix in such a way that a number of unoccupied locations remain in the latter for base modules, at which at least partially at least one sensor element is positioned and electrically connected.

24. The LED display module according to item 23, characterized in that a plurality of target matrices of the same or different sizes are formed on the first carrier along rows and columns with occupiable positions for target matrices at respective distances from one another.

25. The LED display module according to item 23 or 24, characterized in that the base modules form rectangles in a matrix plane and any number of base modules adjacent to each other along a common side are grouped in LED modules.

26. The LED display module according to one of the previous items, characterized in that at least one LED module comprises four base modules in two rows and two columns.

27. The LED display module according to one of the previous items, characterized in that at least one LED module comprises three base modules in two rows and two columns.

28. LED display module according to any one of the preceding items, characterized in that at least seven LED modules with four base modules each and at least two LED modules with three base modules each are positioned and electrically connected to the target matrix in such a way.

29. The LED display module according to item 28, characterized in that at least two locations unoccupied by base modules are generated, at each of which at least one sensor element is positioned and electrically connected.

30 The LED display module according to item 29, characterized in that the positions occupied by sensor elements are framed by base modules.

31. The LED display module according to one of the previous items, characterized in that the base modules are adapted to emit electromagnetic radiation from a first side of the first carrier.

32. The LED display module according to any one of the preceding items, characterized in that the LED modules have base modules, which are formed as subpixels.

33. The LED display module according to one of the previous items, characterized in that are the locations of the target matrices as subpixels of a pixel.

34. The LED display module according to one of the previous items, characterized in that a plurality of sensor elements is formed as part of a sensor device formed on the first carrier to receive electromagnetic radiation incident on a first side of the first carrier.

35. The LED display module according to one of the previous items, characterized in that at least one sensor element is designed as a vital sign monitoring sensor.

36. The LED display module according to item 35, wherein the vital sign monitoring sensor is disposed within a display screen or behind the rear surface of a display screen, and the vital sign monitoring sensor is adapted to measure one or more vital sign parameters of a user who places a body part against the front major surface of the display screen at the vital sign monitoring sensor.

37. The LED display module according to any one of the preceding items, characterized in that a base module each has a first layer formed on a second carrier, an active transition layer formed on the first layer, and a second layer formed on the active transition layer, wherein a first contact is connected to a surface region of the second layer remote from the second carrier, wherein a second contact is connected to a surface region of the first layer remote from the second carrier.

38. The LED display module of item 37, wherein. the second contact is formed by means of a dielectric electrically insulated to the transition layer and to the second layer and extends on the surface region of the second layer facing away from the second carrier.

39. The LED display module according to any one of the preceding items, characterized in that the respective sensor element is in the form of a photodiode, or in the form of a phototransistor, or in the form of a photoresistor, or in the form of an ambient light sensor, or in the form of an infrared sensor, or in the form of an ultraviolet sensor, or in the form of a proximity sensor, or in the form of an infrared component.

40. Method of manufacturing an LED display module having a full-area target matrix formed on a first carrier and having rows and columns of base module occupiable locations, wherein a number of base modules is formed on a second carrier in a start matrix having an equal spacing from locations which can be occupied by base modules to the target matrix, in particular by means of a shallow mesa etching, is grouped there, in particular by means of a deep mesa etching, to form a number of LED modules and these LED modules are separated from the second carrier, in particular by means of laser lift-off or a mechanical or chemical process, characterized in that the LED modules are positioned and electrically connected to the first carrier in the target matrix in such a way that a number of unoccupied locations are left in the latter for base modules, at which at least partially in each case at least one sensor element is positioned and electrically connected.

41. The method according to item 40, characterized in that a plurality of target matrices of the same or different sizes are formed on the first carrier along rows and columns with occupiable positions for target matrices at respective distances from one another.

42. The method according to any one of the preceding items, characterized in that the base modules form rectangles in a matrix plane and any number of base modules adjacent to each other along a common side are grouped in LED modules.

43. The method according to any one of the preceding items, wherein. in at least one LED module four basic modules are grouped in two rows and two columns.

44. The method according to any one of the preceding items, wherein. in at least one LED module three basic modules are grouped in two rows and two columns.

45. The method according to any one of the preceding items, characterized in that at least seven LED modules with four base modules each and at least two LED modules with three base modules each are positioned and electrically connected to the target matrix in such a way that at least two locations unoccupied by base modules are created, at which at least one sensor element is positioned and electrically connected in each case.

46. The method according to any one of the preceding items, wherein the positions occupied by sensor elements are framed by base modules.

47. The method according to any one of the preceding items, wherein the base modules are formed to emit electromagnetic radiation from a first side of the first carrier.

48. The method according to any one of the preceding items, characterized in that a plurality of sensor elements is formed as part of a sensor device formed on the first carrier to receive electromagnetic radiation incident on a first side of the first carrier.

49. The method according to any one of the preceding items, characterized in that a sensor element is formed as a vital sign monitoring sensor.

50. The method according to item 49, characterized in that the vital sign monitoring sensor is disposed within a display screen or behind the rear surface of a display screen, wherein the vital sign monitoring sensor is arranged to measure one or more vital sign parameters of a user who places a body part against the front major surface of the display screen at the vital sign monitoring sensor.

51. The method according to any one of the preceding items, characterized in that a base module each comprises a first layer formed on a second carrier, an active transition layer formed on the first layer, and a second layer formed on the active transition layer, wherein a first contact is connected to a surface portion of the second layer remote from the carrier, wherein a second contact is connected to a surface portion of the first layer remote from the second carrier.

52. The method according to item 51, characterized in that the second contact is formed by means of a dielectric to the transition layer and to the second layer electrically insulated to and extending on the surface region of the second layer facing away from the second support.

53. The method according to any one of the preceding items, characterized in that a sensor element is formed in each case in the form of a photodiode, or in the form of a phototransistor, or in the form of a photoresistor, or in the form of an ambient light sensor, or in the form of an infrared sensor, or in the form of an ultraviolet sensor, or in the form of a proximity sensor, or in the form of an infrared component.

The invention claimed is:

1. A method of manufacturing modules of LEDs, comprising:
   producing at least one layer stack providing a base module on a carrier comprising a first layer, an active layer formed thereon, and a second layer formed thereon;
   exposing of a surface area of the first layer facing away from the carrier;
   forming a first contact to a surface region of the second layer facing away from the carrier;
   forming a second contact to the surface area of the first layer facing away from the carrier;
   forming at least one LED module from the base module by means of deep mesa structuring through the first layer, in particular from a side of the second layer; and
   generating quantum well intermixing in regions of the active layer that extend adjacent to the deep mesa structuring.

2. The method according to claim 1, wherein forming the second contact comprises:
   forming an electrically insulating dielectric over a portion of the active layer and the second layer; and
   forming the second contact with a conductive material electrically contacting the remote surface region of the first layer over the dielectric to a surface region of the second layer remote from the carrier.

3. The method according to claim 1, further comprising exposing the surface region of the first layer facing away from the carrier by means of the flat mesa structuring of the at least one layer stack, in particular from the side of the second layer, wherein in particular a flat trench is produced, surrounding the respective layer stack.

4. The method according to claim 1, further comprising:
   generating a plurality of base modules as a matrix along an X-Y plane along at least one row and along at least one column, wherein base modules of a respective row are oriented the same, wherein optionally:
   the base modules of two adjacent lines are oriented the same way; or
   the base modules of two adjacent rows are oriented in opposite directions, thereby arranging contacts of the same polarity, in particular first contacts, adjacent to each other.

5. The method according to claim 4, further comprising creating a common layer stack of two adjacent base modules oriented opposite to each other.

6. The method according to claim 1, wherein a plurality of base modules are arranged on a different support when structuring the deep mesa, in contrast to exposing the first and second contacts.

7. The method according to claim 1, further comprising at least one of:
   detachment of the base module or the at least one LED module from the carrier, by means of a laser lift-off; or
   detachment of the base module or the at least one LED module from the carrier, by means of a mechanical process.

8. The method according to claim 1, further comprising contacting the contacts of the at least one LED module to a replacement carrier or end carrier, using flip-chip technology.

9. The method according to claim 8, wherein common contact areas are created for contacts of adjacent oppositely oriented base modules of the at least one LED module.

10. The method according to claim 1, wherein:
    the first layer is n-doped and the second layer is p-doped, the active layer being designed in particular for the emission of blue or green light; and/or
    the first layer is p-doped and the second layer is n-doped, the active layer being designed in particular for the emission of red light.

11. The method according to claim 1, wherein:
    the at least one layer stack is created by means of epitaxy; and/or
    exposure and/or grouping is carried out by means of etching.

12. An LED module, comprising:
    a layer stack forming a plurality of base modules, each base module having a first layer formed on a carrier, an active layer and a second layer, wherein a first contact is formed in or on a surface region of the second layer remote from the carrier, and a second contact is formed in or on the surface region of the first layer remote from the carrier, the first and second contacts being spaced apart; and
    wherein at least some of the plurality of base modules base are partially separated from each other by deep mesa structuring through the second layer, the active region, and a part of the first layer, wherein regions of the active layer which run adjacent to deep mesa structuring comprise an increased band gap produced in particular by quantum well intermixing.

13. The LED module of claim 12, wherein a light emitting surface is formed on a side of the layer stack opposite the first and second contacts.

14. The LED module according to claim 12, wherein the second contact is formed by means of a dielectric electrically insulated to the transition layer and to the second layer and formed at the surface region of the second layer facing away from the support.

15. The LED module according to claim 14, wherein the LED module comprises a plurality of base modules arranged in a matrix of at least one row and at least one column.

16. The LED module according to claim 12, wherein the base modules of two adjacent rows are oriented in opposite directions so that contacts of the same polarity, in particular first contacts, are thus arranged adjacent to each other.

17. An LED module, including a light-emitting diode module, produced according to the method of claim 1.

18. A method of manufacturing an LED display module having a full-area target matrix formed on a first carrier and having rows and columns of base module occupiable locations, comprising the steps of:
  forming a number of base modules on a second carrier in a start matrix having an equal spacing corresponding to locations which can be occupied by base modules in the target matrix,
  forming, by means of a deep mesa etching, a number of LED modules that are separated from the second carrier, in particular by means of laser lift-off or a mechanical or chemical process, wherein at least some of the LED modules comprise two or more base modules; and
  positioning and electrically connecting the LED modules to the first carrier in the target matrix in such a way that a number of unoccupied locations are left in the latter for base modules, at which at least partially in each case at least one sensor element is positioned and electrically connected.

19. The method according to claim 18, wherein a plurality of target matrices of a same size or of different sizes are formed on the first carrier along rows and columns with occupiable positions for target matrices at respective distances from one another.

20. The method according to claim 18, wherein the base modules form rectangles in a matrix plane and any number of base modules adjacent to each other along a common side are grouped in LED modules.

21. The method according to claim 18, wherein, in at least one LED module, four basic modules are grouped in two rows and two columns.

22. The method according to claim 18, wherein, in at least one LED module, three basic modules are grouped in two rows and two columns.

23. The method according to claim 18, wherein at least seven LED modules with four base modules each and at least two LED modules with three base modules each are positioned and electrically connected to the target matrix in such a way that at least two locations unoccupied by base modules are created, at which at least one sensor element is positioned and electrically connected in each case.

24. The method according to claim 18, wherein positions occupied by sensor elements are framed by base modules.

25. The method according to claim 18, wherein the base modules are formed to emit electromagnetic radiation from a first side of the first carrier.

26. The method according to claim 18, wherein a plurality of sensor elements is formed as part of a sensor device formed on the first carrier to receive electromagnetic radiation incident on a first side of the first carrier.

27. The method according to claim 18, wherein a sensor element is formed as a vital sign monitoring sensor.

28. The method according to claim 27, wherein the vital sign monitoring sensor is disposed within a display screen or behind the rear surface of a display screen, wherein the vital sign monitoring sensor is arranged to measure one or more vital sign parameters of a user who places a body part against a front major surface of the display screen at the vital sign monitoring sensor.

29. The method according to claim 18, wherein a base module each comprises a first layer formed on a second carrier, an active transition layer formed on the first layer, and a second layer formed on the active transition layer, wherein a first contact is connected to a surface portion of the second layer remote from the carrier, wherein a second contact is connected to a surface portion of the first layer remote from the second carrier.

30. The method according to claim 29, wherein the second contact is formed by means of a dielectric to the transition layer and to the second layer electrically insulated to and extending on the surface region of the second layer facing away from the second support.

31. The method according to claim 18, wherein a sensor element is formed in each case in the form of a photodiode, or in the form of a phototransistor, or in the form of a photoresistor, or in the form of an ambient light sensor, or in the form of an infrared sensor, or in the form of an ultraviolet sensor, or in the form of a proximity sensor, or in the form of an infrared component.

* * * * *